(12) United States Patent
Myung et al.

(10) Patent No.: US 9,806,166 B2
(45) Date of Patent: Oct. 31, 2017

(54) SEMICONDUCTOR DEVICES AND METHODS OF FABRICATING THE SAME

(71) Applicant: Samsung Electronics Co., Ltd., Suwon-si, Gyeonggi-do (KR)

(72) Inventors: Sungwoo Myung, Seoul (KR); GeumJung Seong, Seoul (KR); Jisoo Oh, Incheon (KR); JinWook Lee, Seoul (KR); Dohyoung Kim, Hwaseong-si (KR); Yong-Ho Jeon, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/401,562

(22) Filed: Jan. 9, 2017

(65) Prior Publication Data

US 2017/0200802 A1 Jul. 13, 2017

(30) Foreign Application Priority Data

Jan. 13, 2016 (KR) .................. 10-2016-0004335

(51) Int. Cl.
*H01L 27/088* (2006.01)
*H01L 29/49* (2006.01)
(Continued)

(52) U.S. Cl.
CPC .... *H01L 29/4983* (2013.01); *H01L 21/76805* (2013.01); *H01L 21/76895* (2013.01); *H01L 23/535* (2013.01); *H01L 27/0886* (2013.01); *H01L 29/0653* (2013.01); *H01L 29/161* (2013.01); *H01L 29/1608* (2013.01); *H01L 29/4966* (2013.01); *H01L 29/66545* (2013.01); *H01L 29/66636* (2013.01); *H01L 29/66795* (2013.01); *H01L 29/7848* (2013.01)

(58) Field of Classification Search
CPC ............ H01L 29/4983; H01L 29/0653; H01L 29/1608; H01L 29/161; H01L 29/4966; H01L 29/66545; H01L 29/66636; H01L 29/66795; H01L 29/7848; H01L 21/76805; H01L 21/76895; H01L 23/535; H01L 27/0886
USPC ........................................................ 257/401
See application file for complete search history.

(56) References Cited

U.S. PATENT DOCUMENTS 7,935,598 B2  5/2011 Lee
8,013,388 B2  9/2011 Seo
(Continued)

FOREIGN PATENT DOCUMENTS

JP   2008-218805 A   9/2008
KR   2003-0001916 A   1/2003

*Primary Examiner* — Tu-Tu Ho
(74) *Attorney, Agent, or Firm* — Lee & Morse, P.C.

(57) ABSTRACT

A semiconductor device includes an active pattern, a gate electrode, a gate capping pattern, and a gate spacer. The active pattern extends in a first direction parallel to a top surface of the substrate. The gate electrode extends in a second direction parallel to the top surface of the substrate and intersects the active pattern. The gate capping pattern covers a top surface of the gate electrode and extends in a direction crossing the top surface of the substrate to cover a first sidewall of the gate electrode. The gate spacer covers a second sidewall of the gate electrode. The first sidewall and the second sidewall are opposite to each other in the second direction.

20 Claims, 22 Drawing Sheets

(51) Int. Cl.
*H01L 29/06* (2006.01)
*H01L 29/16* (2006.01)
*H01L 29/161* (2006.01)
*H01L 29/78* (2006.01)
*H01L 23/535* (2006.01)
*H01L 29/66* (2006.01)
*H01L 21/768* (2006.01)

(56) References Cited

U.S. PATENT DOCUMENTS

| | | |
|---|---|---|
| 8,546,208 B2 | 10/2013 | Anderson et al. |
| 8,878,260 B2 | 11/2014 | Anderson et al. |
| 9,536,983 B2 * | 1/2017 | Lee .................. H01L 29/6656 |
| 2013/0011987 A1 | 1/2013 | Park |
| 2014/0001572 A1 | 1/2014 | Bohr et al. |
| 2016/0181425 A1 | 6/2016 | Bai et al. |

* cited by examiner

FIG. 14
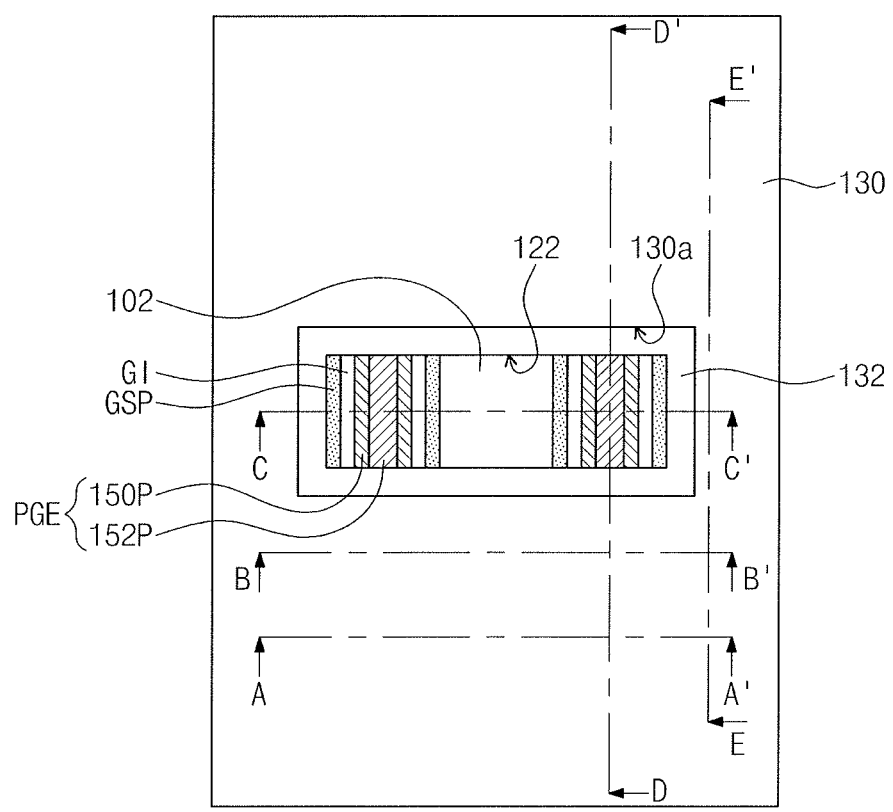
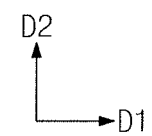

FIG. 20
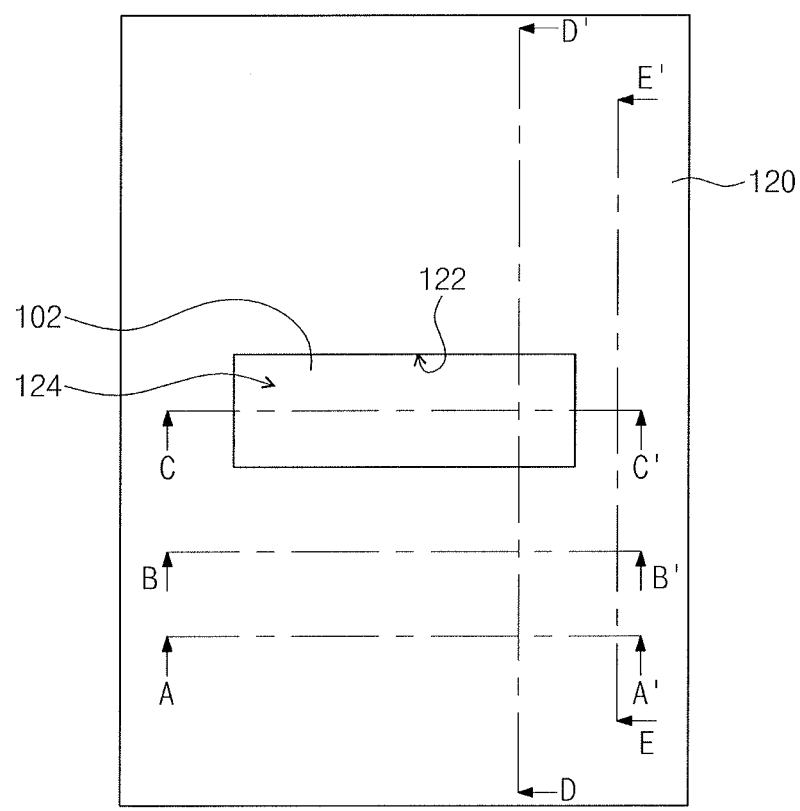
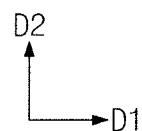

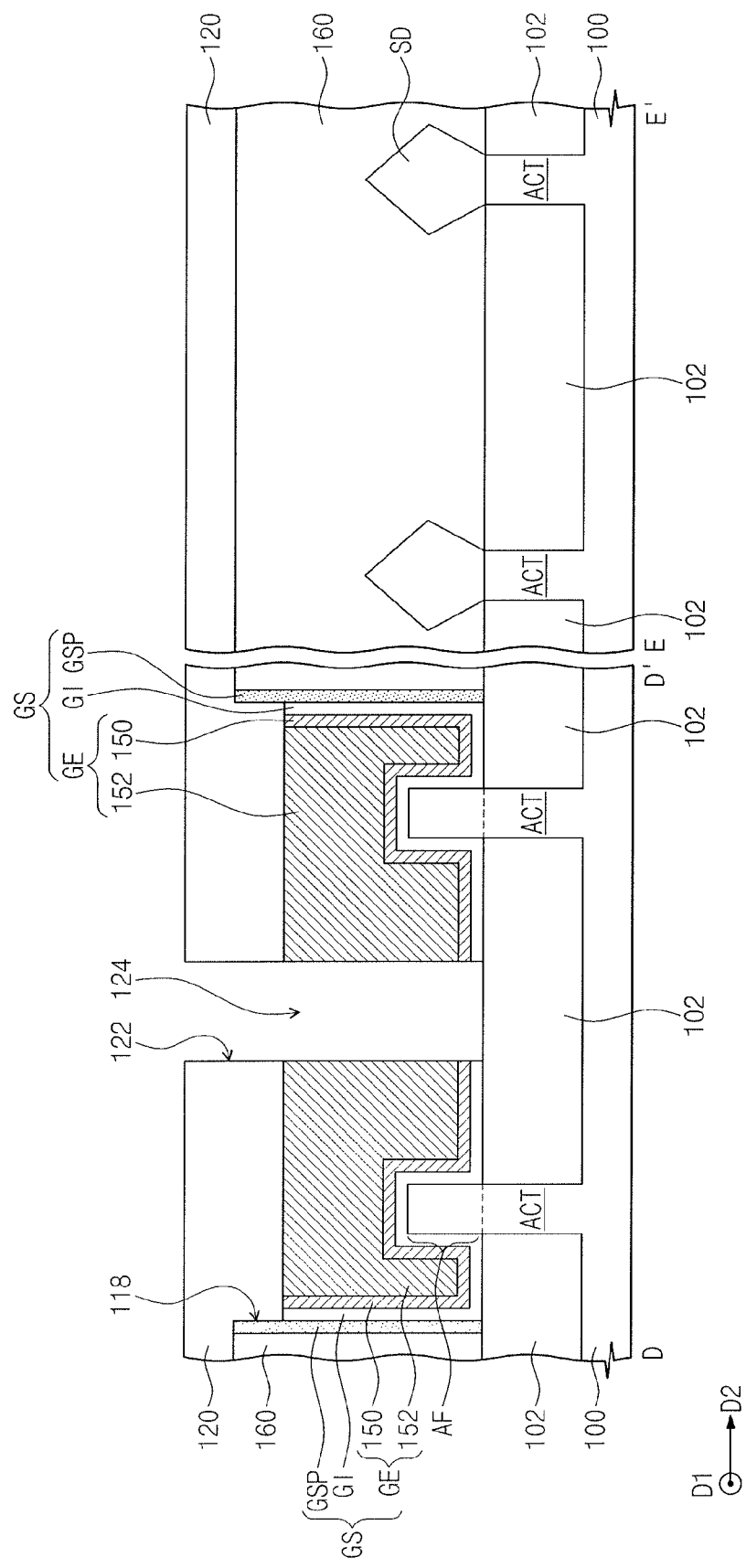

SEMICONDUCTOR DEVICES AND METHODS OF FABRICATING THE SAME

CROSS-REFERENCE TO RELATED APPLICATION

Korean Patent Application No. 10-2016-0004335, filed on Jan. 13, 2016, and entitled, "Semiconductor Devices and Methods of Fabricating the Same," is incorporated by reference herein in its entirety.

BACKGROUND

1. Field

One or more embodiments described herein relate to semiconductor devices and methods of fabricating the semiconductor devices.

2. Description of the Related Art

Semiconductor devices typically include metal-oxide-semiconductor field effect transistors (MOSFETs) incorporated into integrated circuits. Increases in integration require a scaling down of the sizes of the MOSFETs. This may produce a deterioration in operating characteristics.

SUMMARY

In accordance with one or more embodiments, a semiconductor device includes an active pattern on a substrate, the active pattern extending in a first direction parallel to a top surface of the substrate; a gate electrode extending in a second direction parallel to the top surface of the substrate and intersecting the active pattern, the second direction intersecting the first direction; a gate capping pattern covering a top surface of the gate electrode, the gate capping pattern extending in a direction crossing the top surface of the substrate to cover a first sidewall of the gate electrode; and a gate spacer covering a second sidewall of the gate electrode, wherein the first sidewall and the second sidewall are opposite to each other in the second direction.

In accordance with one or more other embodiments, a semiconductor device includes a pair of gate electrodes on a substrate, the pair of gate electrodes spaced apart from each other in a first direction parallel to a top surface of the substrate; and a gate capping pattern covering top surfaces of the pair of gate electrodes, the gate capping pattern extending in a direction perpendicular to the top surface of the substrate to fill a space between the pair of gate electrodes, wherein each of the pair of gate electrodes has a line shape having a first width in the first direction and a second width in a second direction, wherein the second direction is parallel to the top surface of the substrate and is perpendicular to the first direction, and the first width is greater than the second width.

In accordance with one or more other embodiments, a method of fabricating a semiconductor device includes forming a sacrificial gate pattern on a substrate; forming a gate spacer covering sidewalls of the sacrificial gate pattern on the substrate; forming an interlayer insulating layer covering the sacrificial gate pattern and the gate spacer on the substrate; removing the sacrificial gate pattern to form a gap region defined by an inner sidewall of the gate spacer; forming a preliminary gate electrode in the gap region; forming a cutting mask pattern having an opening exposing a portion of a top surface of the preliminary gate electrode on the interlayer insulating layer; and dividing the preliminary gate electrode into a pair of gate electrodes by removing a portion of the preliminary gate electrode using the cutting mask pattern as an etch mask.

In accordance with one or more other embodiments, a semiconductor device includes an active pattern on a substrate; a gate electrode on the active pattern; a gate capping pattern on a first sidewall of the gate electrode; a gate spacer on a second sidewall of the gate electrode opposing the first sidewall and on at least one of a third sidewall or a fourth sidewall of the gate electrode.

BRIEF DESCRIPTION OF THE DRAWINGS

Features will become apparent to those of skill in the art by describing in detail exemplary embodiments with reference to the attached drawings in which:

FIGS. 5, 8, 11, 14, 17, and 20 illustrate various stages of an embodiment of a method for fabricating a semiconductor device;

FIGS. 7, 10, 13, 16, 19, and 22 illustrate views taken along section lines D-D' and E-E' in FIGS. 5, 8, 11, 14, 17, and 20.

DETAILED DESCRIPTION

Figure 1:
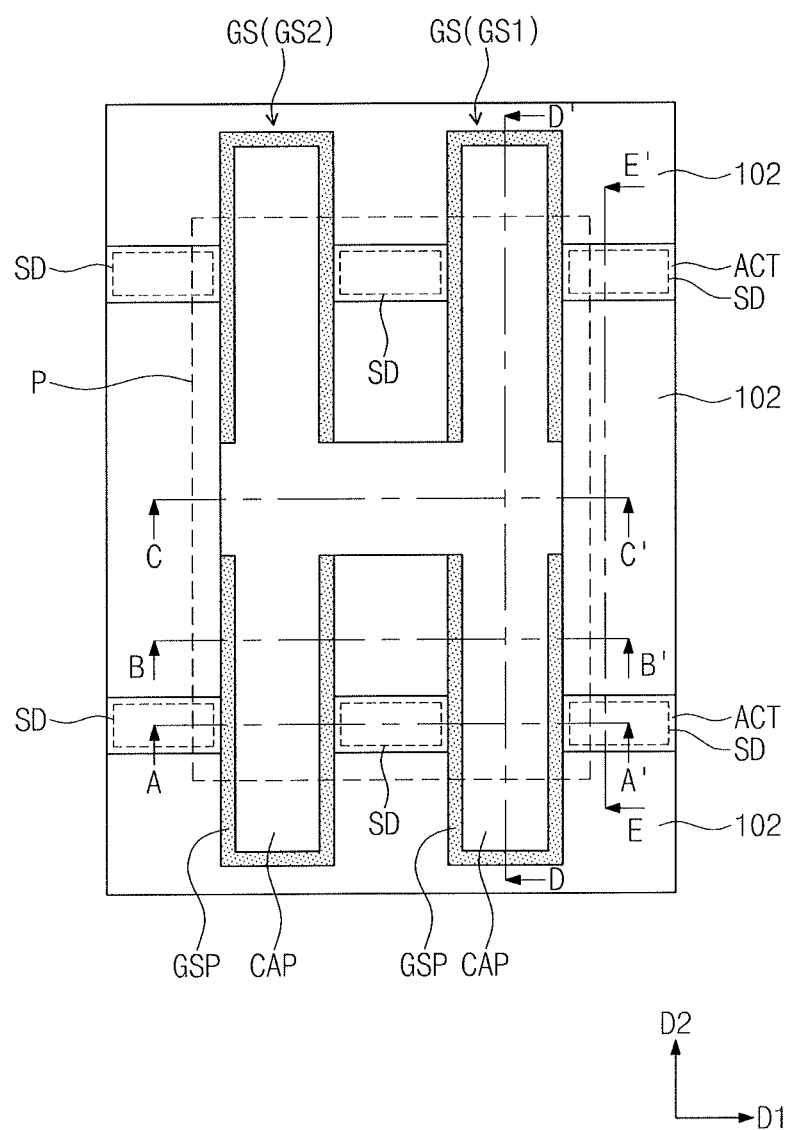
FIG. 1 illustrates an embodiment of a semiconductor device.
Figure 2:
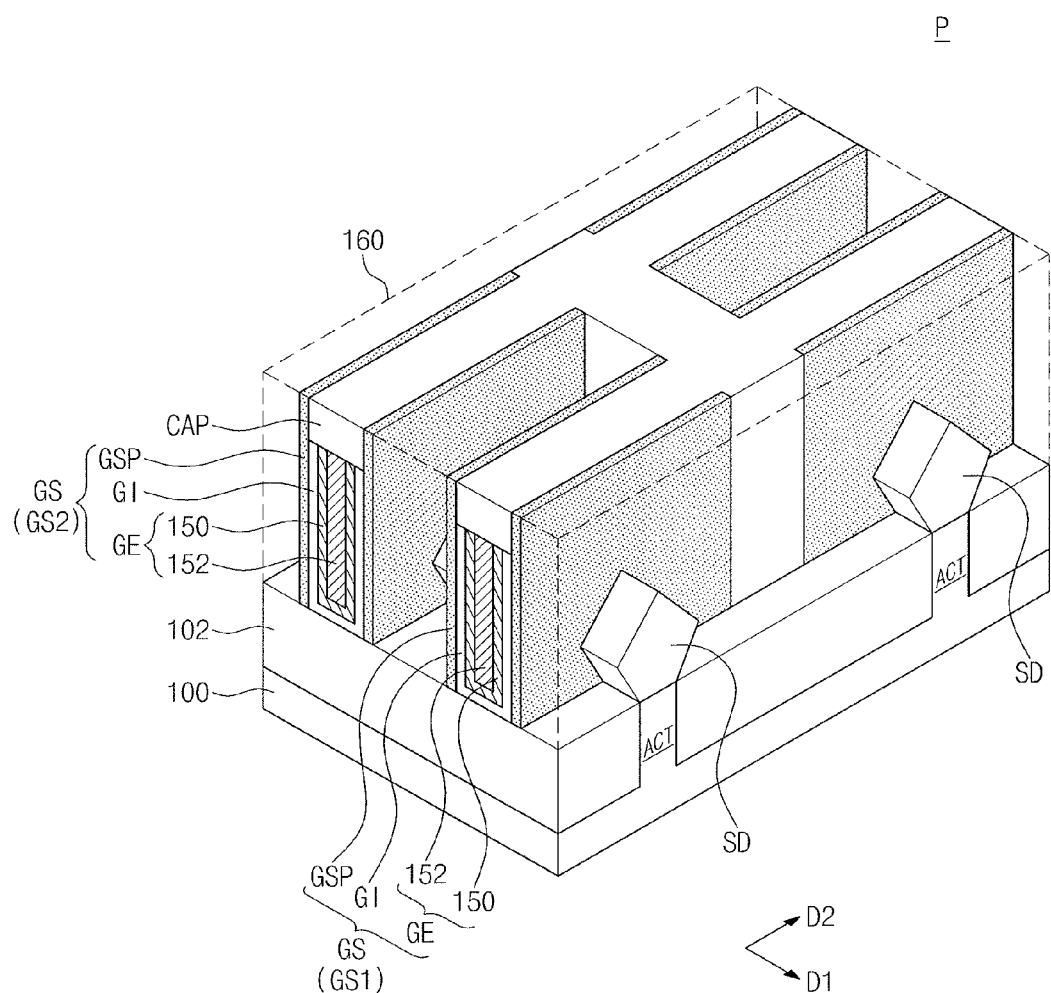
FIG. 2 illustrates an embodiment of portion P in FIG. 1.
Figure 3:
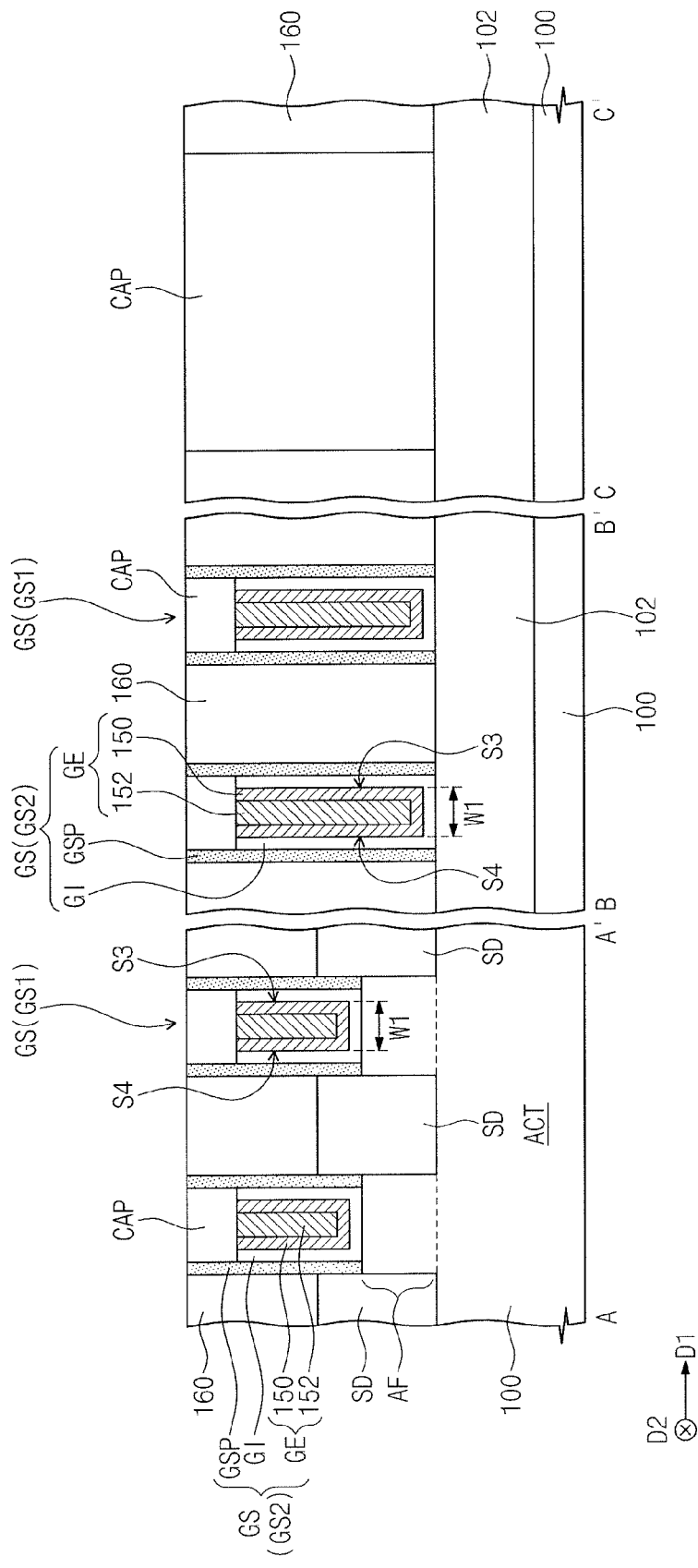
FIG. 3 illustrates views taken along section lines A-A', B-B', and C-C' in FIG. 1.
Figure 4:
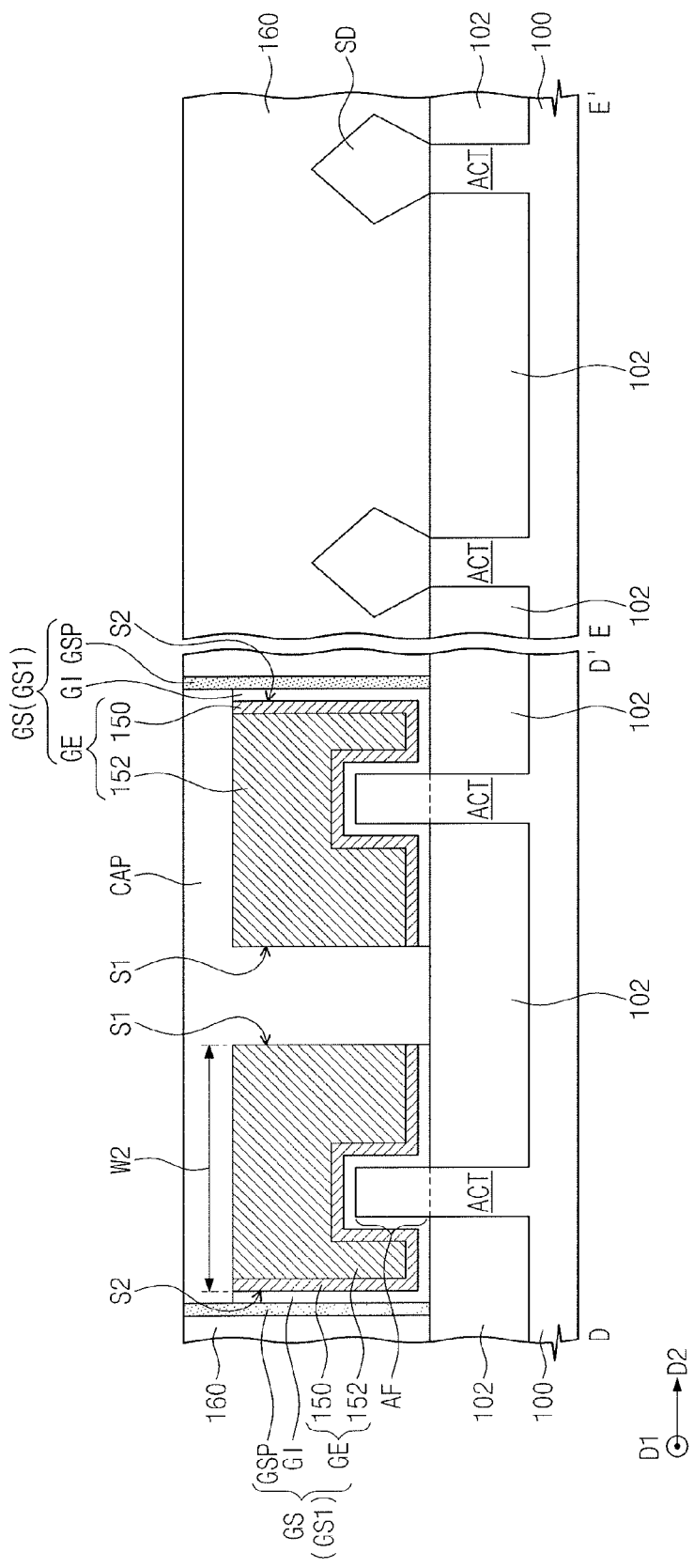
FIG. 4 illustrates a view taken along section lines D-D' and E-E' in FIG. 1.

FIGS. 1-4 illustrate an embodiment of a semiconductor device which includes an active pattern ACT on a substrate 100, which, for example, may be a semiconductor substrate. For example, the substrate 100 may be a silicon substrate or a silicon-on-insulator (SOI) substrate.

The active pattern ACT may protrude from the substrate 100 in a direction perpendicular to a top surface of the substrate 100 and may extend in a first direction D1 parallel to the top surface of the substrate 100. In some embodiments, a plurality of active patterns ACT may be provided and arranged in a second direction D2 intersecting the first direction D1 parallel to the top surface of the substrate 100.

Device isolation patterns 102 may be provided at respective sides of the active pattern ACT. The device isolation patterns 102 may be on the substrate 100 and may extend in the first direction D1. The device isolation patterns 102 may be spaced apart from each other in the second direction D2, with the active pattern ACT therebetween. The device isolation patterns 102 may include at least one of an oxide, a nitride, or an oxynitride. In some embodiments, the device isolation patterns 102 may expose sidewalls of an upper portion of the active pattern ACT. For example, the active pattern ACT may have an upper portion (an active fin AF) exposed by the device isolation patterns 102. In certain embodiments, a top surface of the active pattern ACT may be substantially coplanar with top surfaces of the device isolation patterns 102, unlike FIGS. 1 to 4.

A gate electrode GE may be on the substrate 100 to intersect the active pattern ACT and the device isolation patterns 102. The gate electrode GE may cover the active fin AF and may extend in the second direction D2 to cover top surfaces of the device isolation patterns 102. The gate electrode GE may have a first sidewall S1 and a second sidewall S2 opposite to each other in the second direction D2, and may have a third sidewall S3 and a fourth sidewall S4 opposite to each other in the first direction D1. The gate electrode GE may have a line shape extending in the second direction D2.

In some embodiments, the gate electrode GE may have a width W1 in the first direction D1 (e.g., a width between the third and fourth sidewalls S3 and S4) and a width W2 in the second direction D2 (e.g., a width between the first and second sidewalls S and S2). The width W2 in the second direction D2 of the gate electrode GE may be greater than the width W1 in the first direction D1 of the gate electrode GE.

A gate capping pattern CAP may be on a top surface of the gate electrode GE. The gate capping pattern CAP may extend in the second direction D2 and cover the top surface of the gate electrode GE. The gate capping pattern CAP may further extend in a direction perpendicular to the top surface of the substrate 100 to cover the first sidewall S1 of the gate electrode GE. In addition, the gate capping pattern CAP may be in contact with the device isolation pattern 102 adjacent to the first sidewall S1. The gate capping pattern CAP may be in direct contact with the top surface and the first sidewall S1 of the gate electrode GE.

A gate spacer GSP may be on the second sidewall S2 of the gate electrode GE and may extend onto the third sidewall S3 and the fourth sidewall S4 of the gate electrode GE. The gate capping pattern CAP may extend from the first sidewall S1 of the gate electrode GE in a direction (e.g., the first direction D1) parallel to the top surface of the substrate 100, so as to be in contact with the gate spacer GSP when viewed from a plan view. In some embodiments, the gate spacer GSP may cover sidewalls of the gate capping pattern CAP and a top surface of the gate spacer GSP may be substantially coplanar with a top surface of the gate capping pattern CAP.

A gate dielectric pattern GI may be between the gate electrode GE and the active fin AF. The gate dielectric pattern GI may extend between the gate electrode GE and the device isolation patterns 102 and may extend between the gate electrode GE and the gate spacer GSP. The topmost surface of the gate dielectric pattern GI may be substantially coplanar with the top surface of the gate electrode GE.

The gate capping pattern CAP may laterally extend from the top surface of the gate electrode GE to cover the topmost surface of the gate dielectric pattern GI. The gate spacer GSP may be spaced apart from the gate electrode GE, with the gate dielectric pattern GI interposed therebetween. The gate capping pattern CAP may be in direct contact with the first sidewall S1 of the gate electrode GE. The gate capping pattern CAP may extend from the first sidewall S1 of the gate electrode GE in the direction (e.g., first direction D1) parallel to the top surface of the substrate 100, so as to be in contact with the gate dielectric pattern GI and the gate spacer GSP when viewed from a plan view.

The gate electrode GE may include a first conductive pattern 150 adjacent to the gate dielectric pattern GI and a second conductive pattern 152 spaced apart from the gate dielectric pattern GI, with the first conductive pattern 150 interposed therebetween. The second conductive pattern 152 may include a different material from the first conductive pattern 150.

The first conductive pattern 150 may extend along a top surface of the gate dielectric pattern GI. For example, the first conductive pattern 150 may be between the second conductive pattern 152 and the active fin AF and may extend between the second conductive pattern 152 and each of the device isolation patterns 102. The first conductive pattern 150 may extend between the second conductive pattern 152 and the gate spacer GSP.

The gate capping pattern CAP may cover top surfaces of the first and second conductive patterns 150 and 152 and may extend in the direction perpendicular to the top surface of the substrate 100, so as to be in direct contact with a sidewall of the second conductive pattern 152 and a sidewall of the first conductive pattern 150. The sidewall of the second conductive pattern 152 and the sidewall of the first conductive pattern 150 may constitute at least a portion of the first sidewall S1 of the gate electrode GE. The gate capping pattern CAP may extend from the sidewall of the second conductive pattern 152 in the direction (e.g., the first direction D1) parallel to the top surface of the substrate 100, so as to be in direct contact with the first conductive pattern 150 when viewed from a plan view.

The first conductive pattern 150 may include, for example, a conductive metal nitride (e.g., titanium nitride or tantalum nitride). The second conductive pattern 152 may include, for example, at least one of a conductive metal nitride (e.g., titanium nitride or tantalum nitride) or a metal (e.g., aluminum or tungsten). The second conductive pattern 152 may include a different material from the first conductive pattern 150. The gate dielectric pattern GI may include at least one high-k dielectric material. For example, the gate dielectric pattern GI may include at least one of hafnium oxide, hafnium silicate, zirconium oxide, or zirconium silicate. The gate spacer GSP and the gate capping pattern CAP may include, for example, a nitride (e.g., silicon nitride).

The gate electrode GE, the gate dielectric pattern GI, and the gate spacer GSP may be defined as a gate structure GS. In one embodiment, a plurality of gate structures GS may be provided. For example, a pair of gate structures GS may be spaced apart from each other in the second direction D2. Each of the pair of gate structures GS may intersect a corresponding one of the active patterns ACT. The pair of gate structures GS may include a pair of gate electrodes GE spaced apart from each other in the second direction D2, respectively.

The gate capping pattern CAP may cover top surfaces of the pair of gate electrodes GE and may extend in the direction perpendicular to the top surface of the substrate 100 to fill a space between the pair of gate structures GS. For example, each of the pair of gate electrodes GE may have the first to fourth sidewalls S1, S2, S3, and S4. The first sidewalls S1 of the pair of gate electrodes GE may face each other. The gate capping pattern CAP may fill the space between the first sidewalls S facing each other and may be in contact with the device isolation pattern 102 between the pair of gate electrodes GE.

The gate capping pattern CAP may be in direct contact with the first sidewalls S1 of the pair of gate electrodes GE. The gate capping pattern CAP may extend from the first sidewalls S1 of the pair of gate electrodes GE in the direction (e.g., the first direction D1) parallel to the top surface of the substrate 100, so as to be in contact with the gate dielectric patterns GI and the gate spacers GSP on sidewalls of the pair of gate electrodes GE when viewed from a plan view.

In some embodiments, another pair of gate structures GS may be spaced apart from each other in the second direction D2. For example, the pair of gate structures GS may be defined as first gate structures GS1 and the other pair of gate structures GS may be defined as second gate structures GS2. The second gate structures GS2 may be spaced apart from the first gate structures GS1 in the first direction D1, respectively. Each of the second gate structures GS2 may intersect a corresponding one of active patterns ACT.

The second gate structures GS2 may include another pair of gate electrodes GE spaced apart from each other in the second direction D2, respectively. An additional gate capping pattern CAP may be on top surfaces of the another pair of gate electrodes GE and may extend in the direction perpendicular to the top surface of the substrate 100 to fill a space between the second gate structures GS2. For example, each of the other pair of gate electrodes GE may have the first to fourth sidewalls S1, S2, S3, and S4. The first sidewalls S1 of the other pair of gate electrodes GE may face each other.

The additional gate capping pattern CAP may fill the space between the first sidewalls S1 facing each other and may be in contact with the device isolation pattern 102 between the another pair of gate electrodes GE. The additional gate capping pattern CAP may be in direct contact with the first sidewalls S1 of the other pair of gate electrodes GE. The additional gate capping pattern CAP may extend from the first sidewalls S1 of the other pair of gate electrodes GE in the direction (e.g., the first direction D1) parallel to the top surface of the substrate 100, so as to be in contact with the gate dielectric patterns GI and the gate spacers GSP on sidewalls of the another pair of gate electrodes GE when viewed from a plan view.

The gate capping pattern CAP on the first gate structures GS1 may extend in the first direction D1, so as to be connected to the additional gate capping pattern CAP on the second gate structures GS2 when viewed from a plan view. In some embodiments, the gate capping pattern CAP may extend from the space between the first gate structures GS1 to the space between the second gate structures GS2 along the first direction D1, so as to be connected to the additional gate capping pattern CAP. The gate capping pattern CAP and the additional gate capping pattern CAP may be connected to each other to constitute one gate capping pattern CAP that is in one body. For example, a portion of the one gate capping pattern CAP may extend from the space between the first gate structures GS1 into the space between the second gate structures GS2 along the first direction D1. A bottom surface of the portion of the one gate capping pattern CAP may be in contact with the device isolation pattern 102 thereunder.

Source/drain regions SD may be on the active pattern ACT at respective sides of the gate structure GS. The source/drain regions SD may be laterally spaced apart from each other, with the active fin AF therebetween. Bottom surfaces of the source/drain regions SD may be lower than a top surface of the active fin AF.

The source/drain regions SD may include epitaxial layers formed using the active pattern ACT as a seed. For example, the source/drain regions SD may include at least one selected from a group consisting of silicon-germanium (SiGe), silicon (Si), and silicon carbide (SiC) formed by an epitaxial growth process using the active pattern ACT as a seed.

In some embodiments, when the semiconductor device includes a complementary metal-oxide-semiconductor (CMOS) structure, a first epitaxial layer may be provided for source/drain regions of an N-channel metal-oxide-semiconductor field effect transistor (NMOSFET) and a second epitaxial layer may be provided for source/drain regions of a P-channel MOSFET (PMOSFET). The first epitaxial layer may provide a tensile strain to a channel region (e.g., the active fin AF) of the NMOSFET. The second epitaxial layer may provide a compressive strain to a channel region (e.g., the active fin AF) of the PMOSFET. For example, the first epitaxial layer may be formed of silicon (Si) and/or silicon carbide (SiC), and the second epitaxial layer may be formed of silicon-germanium (SiGe). The first and second epitaxial layers may be formed from different materials in another embodiment. The source/drain regions SD may further include dopants. The dopants may be employed to improve electrical characteristics of a transistor including the source/drain regions SD. When the transistor is an NMOSFET, the dopants may be, for example, phosphorus (P). When the transistor is a PMOSFET, the dopants may be, for example, boron (B).

An interlayer insulating layer 160 may be on the substrate 100 to cover the gate structure GS, the gate capping pattern CAP, and the source/drain regions SD. For example, the interlayer insulating layer 160 may include at least one of a silicon oxide layer, a silicon nitride layer, a silicon oxynitride layer, or a low-k dielectric layer.

In some embodiments, a top surface of the gate capping pattern CAP may be substantially coplanar with a top surface of the interlayer insulating layer 160. The gate spacer GSP may extend between the gate capping pattern CAP and the interlayer insulating layer 160. The gate capping pattern CAP may extend from the first sidewall S1 of the gate electrode GE in the first direction D1, so as to be in contact with the interlayer insulating layer 160. When a plurality of gate structures GS is provided, the gate capping pattern CAP may extend from the space between the first gate structures GS1 into the space between the second gate structures GS2 in the first direction D1 and may laterally penetrate the interlayer insulating layer 160, so as to be connected to the additional gate capping pattern CAP.

An insulating layer may be on the interlayer insulating layer 160. The insulating layer may include, for example, at least one of an oxide, a nitride, or an oxynitride. First contact plugs may penetrate the insulating layer and the interlayer insulating layer 160, so as to be electrically connected to the source/drain regions SD. A second contact plug may penetrate the insulating layer and the gate capping pattern CAP, so as to be electrically connected to the gate electrode GE.

Interconnections may be on the insulating layer and may be connected to the first and second contact plugs. The interconnections may be electrically connected to the source/drain regions SD and the gate electrode GE through the first and second contact plugs. Operating voltages may be applied to the source/drain regions SD and the gate electrode GE through the interconnections and the first and second contact plugs. The first and second contact plugs and the interconnections may include a conductive material.

FIGS. 5, 8, 11, 14, 17, and 20 are plan views illustrating various stages in an embodiment of a method for fabricating a semiconductor device. FIGS. 6, 9, 12, 15, 18, and 21 are cross-sectional views taken along lines A-A', B-B', and C-C' in FIGS. 5, 8, 11, 14, 17, and 20. FIGS. 7, 10, 13, 16, 19, and 22 are cross-sectional views taken along lines D-D' and E-E' in FIGS. 5, 8, 11, 14, 17, and 20.

Figure 5:
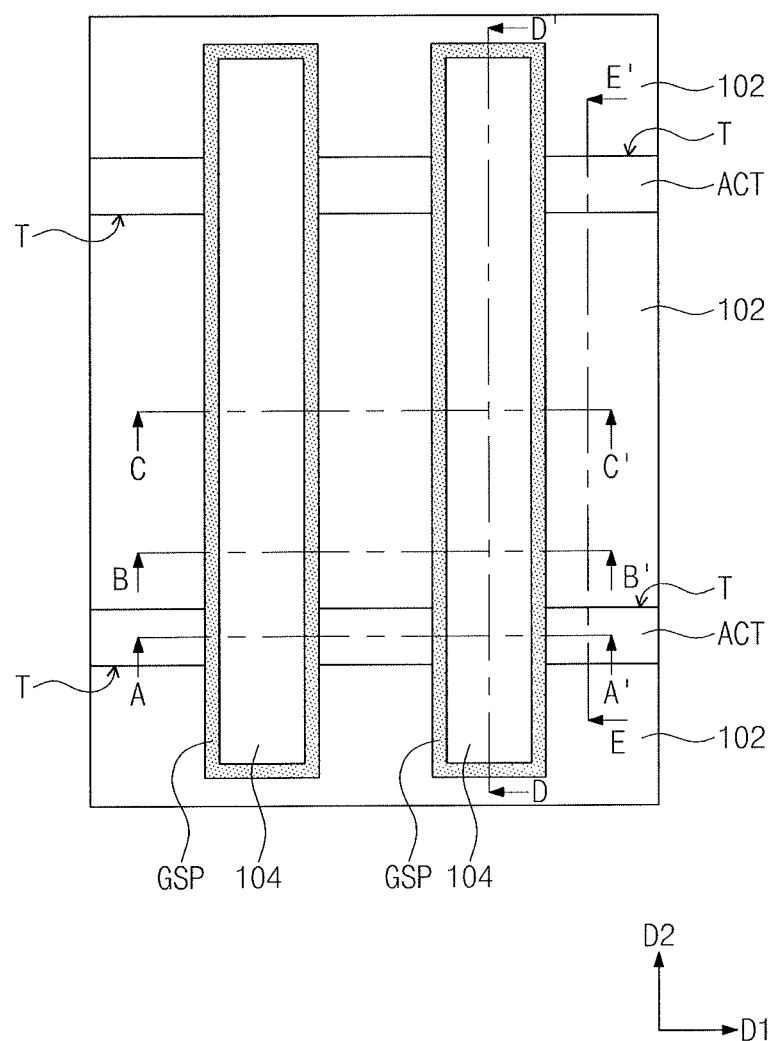
Figure 6:
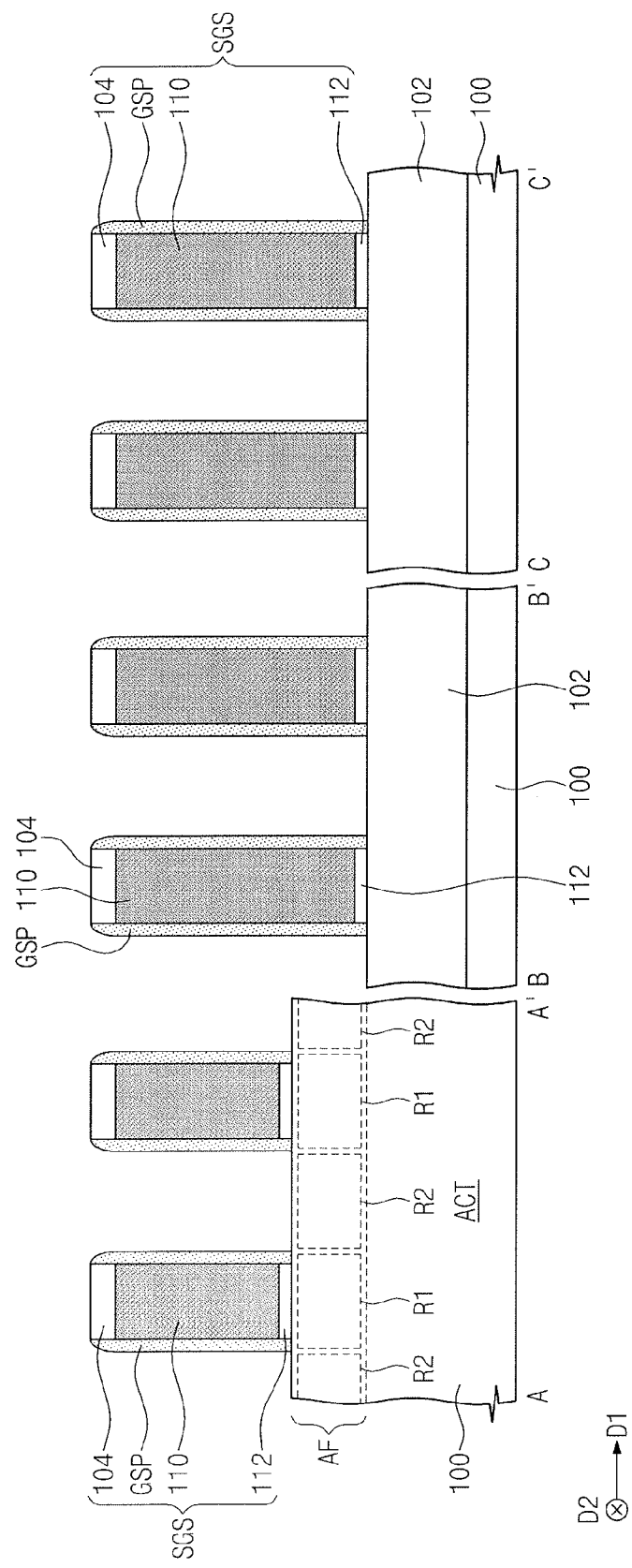
FIGS. 6, 9, 12, 15, 18, and 21 illustrate views taken along section lines A-A', B-B', and C-C' in FIGS. 5, 8, 11, 14, 17, and 20.
Figure 7:
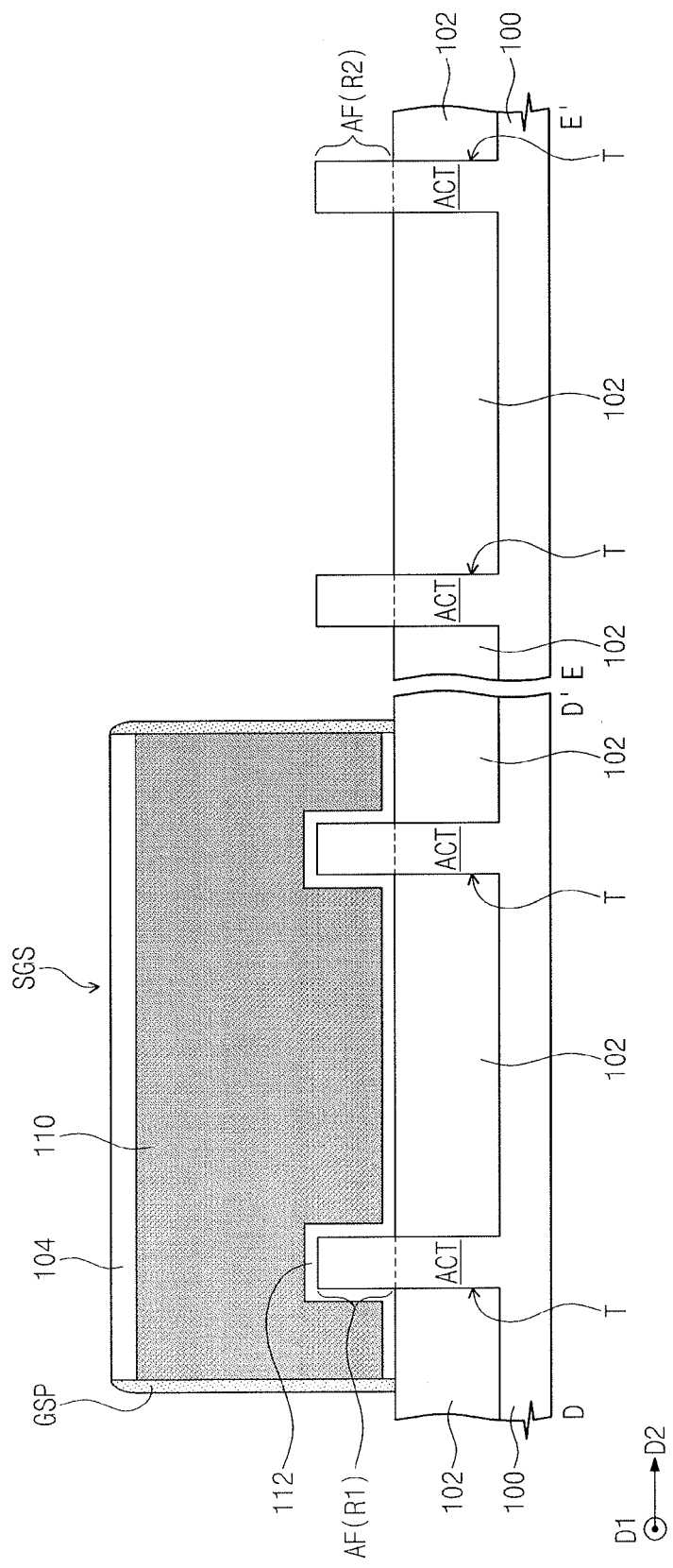

Referring to FIGS. 5 to 7, an active pattern ACT may be formed on a substrate 100. In some embodiments, forming the active pattern ACT may include patterning the substrate 100 to form trenches T defining the active pattern ACT. The trenches T may have linear shapes extending in the first direction D1 and may be spaced apart from each other in the second direction D2. In some embodiments, a mask pattern defining the active pattern ACT may be formed on the substrate 100, and the substrate 100 may be anisotropically etched using the mask pattern as an etch mask to form the trenches T.

Device isolation patterns 102 may be formed at respective sides of the active pattern ACT. The device isolation patterns 102 may be formed to fill the trenches T. Forming the device isolation patterns 102 may include, for example, forming an insulating layer filling the trenches T on the substrate 100 and planarizing the insulating layer until the mask pattern is exposed.

Upper portions of the device isolation patterns 102 may be recessed to expose an upper portion of the active pattern ACT. The upper portion of the active pattern ACT, exposed by the device isolation patterns 102, may be defined as an active fin AF. The upper portions of the device isolation patterns 102 may be recessed, for example, by a wet etching process using an etch recipe having an etch selectivity with respect to the active pattern ACT. The mask pattern may be removed while the upper portions of the device isolation patterns 102 are recessed.

A sacrificial gate pattern 110 may be formed on the substrate 100 to intersect the active pattern ACT and the device isolation patterns 102. The sacrificial gate pattern 110 may extend in the second direction D2. The sacrificial gate pattern 110 may cover a top surface and sidewalls of the active pattern ACT (e.g., the active fin AF) and may extend onto top surfaces of the device isolation patterns 102. When a plurality of active patterns ACT are formed, the active patterns ACT may extend in the first direction D1 and may be spaced apart from each other in the second direction D2. In this case, the sacrificial gate pattern 110 may extend in second direction D2 to intersect the active patterns ACT.

An etch stop pattern 112 may be provided between the sacrificial gate pattern 110 and the active pattern ACT, and may extend between the sacrificial gate pattern 110 and each of the device isolation patterns 102. In some embodiments, an etch stop layer and a sacrificial gate layer may be sequentially formed on the substrate 100 to cover the active pattern ACT and the device isolation patterns 102. A sacrificial mask pattern 104 defining the sacrificial gate pattern 110 may be formed on the sacrificial gate layer.

The sacrificial gate layer and the etch stop layer may be sequentially etched, using the sacrificial mask pattern 104 as an etch mask, to form the sacrificial gate pattern 110 and the etch stop pattern 112. For example, the etch stop layer may include a silicon oxide layer. The sacrificial gate layer may include a material having an etch selectivity with respect to the etch stop layer. For example, the sacrificial gate layer may include a poly-silicon layer. The sacrificial gate layer may be patterned using the sacrificial mask pattern 104 as the etch mask to form the sacrificial gate pattern 110.

Patterning the sacrificial gate layer may include performing an etching process having an etch selectivity with respect to the etch stop layer. The etch stop layer at respective sides of the sacrificial gate pattern 110 may be removed after the formation of the sacrificial gate pattern 110. Thus, the etch stop pattern 112 may be formed under the sacrificial gate pattern 110.

A gate spacer GSP may be formed on sidewalls of the sacrificial gate pattern 110. The gate spacer GSP may include, for example, silicon nitride. Forming the gate spacer GSP may include forming a gate spacer layer covering the sacrificial gate pattern 110 on the substrate 100 and anisotropically etching the gate spacer layer.

The sacrificial mask pattern 104, the sacrificial gate pattern 110, the etch stop pattern 112, and the gate spacer GSP may be defined as a sacrificial gate structure SGS. Since the sacrificial gate structure SGS intersects the active pattern ACT, one or more first regions R1 and second regions R2 may be defined in the active fin AF. Each first region R1 may be under a sacrificial gate structure SGS. For example, the first region R1 may correspond to a region of the active fin AF which overlaps with the sacrificial gate structure SGS when viewed from a plan view. The second regions R2 may correspond to other regions of the active fin AF at respective sides of the sacrificial gate structure SGS and are laterally spaced apart from each other by the first region R1.

Figure 8:
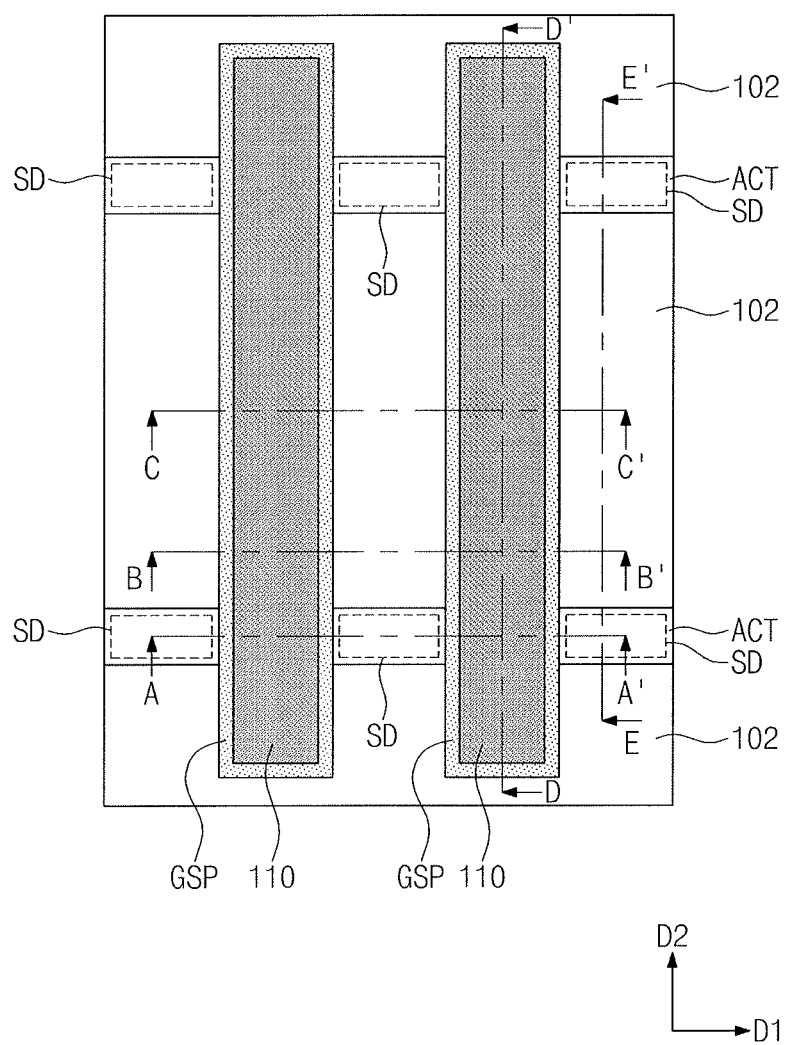
Figure 9:
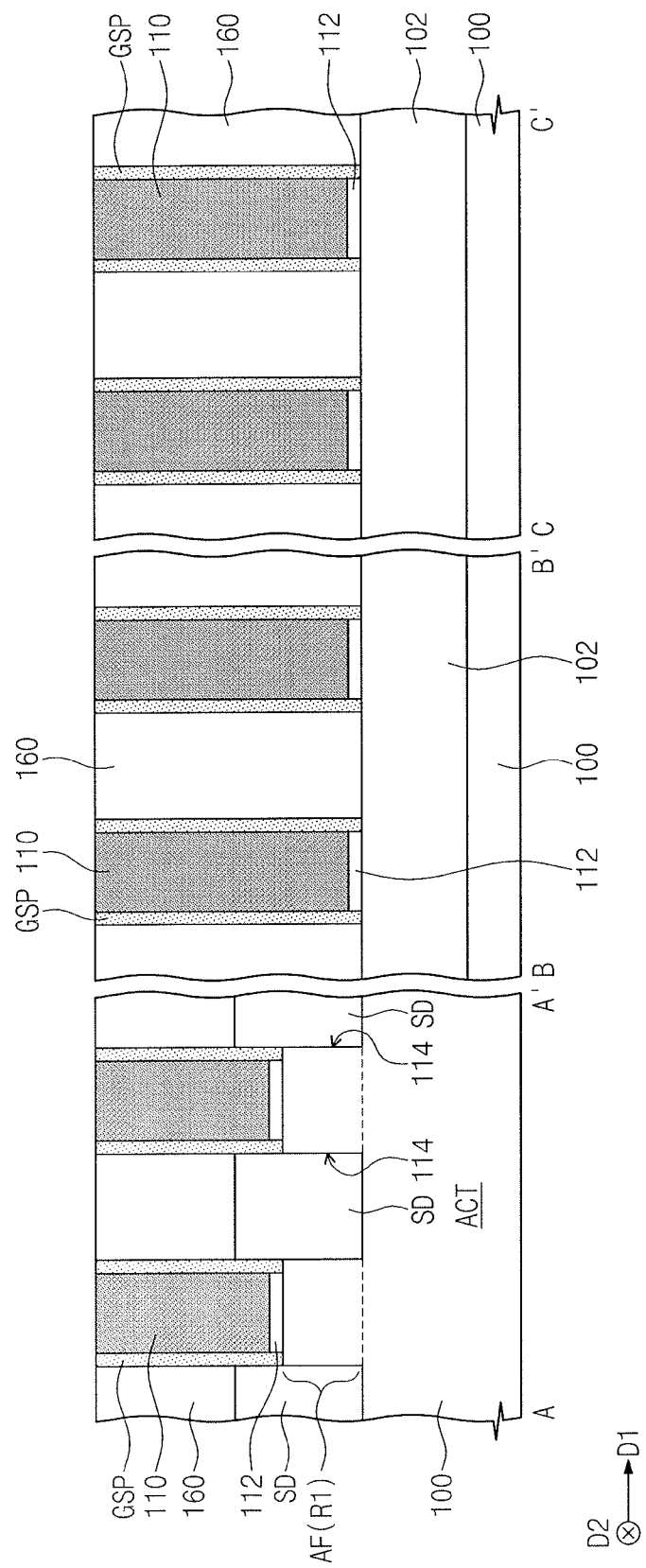
Figure 10:
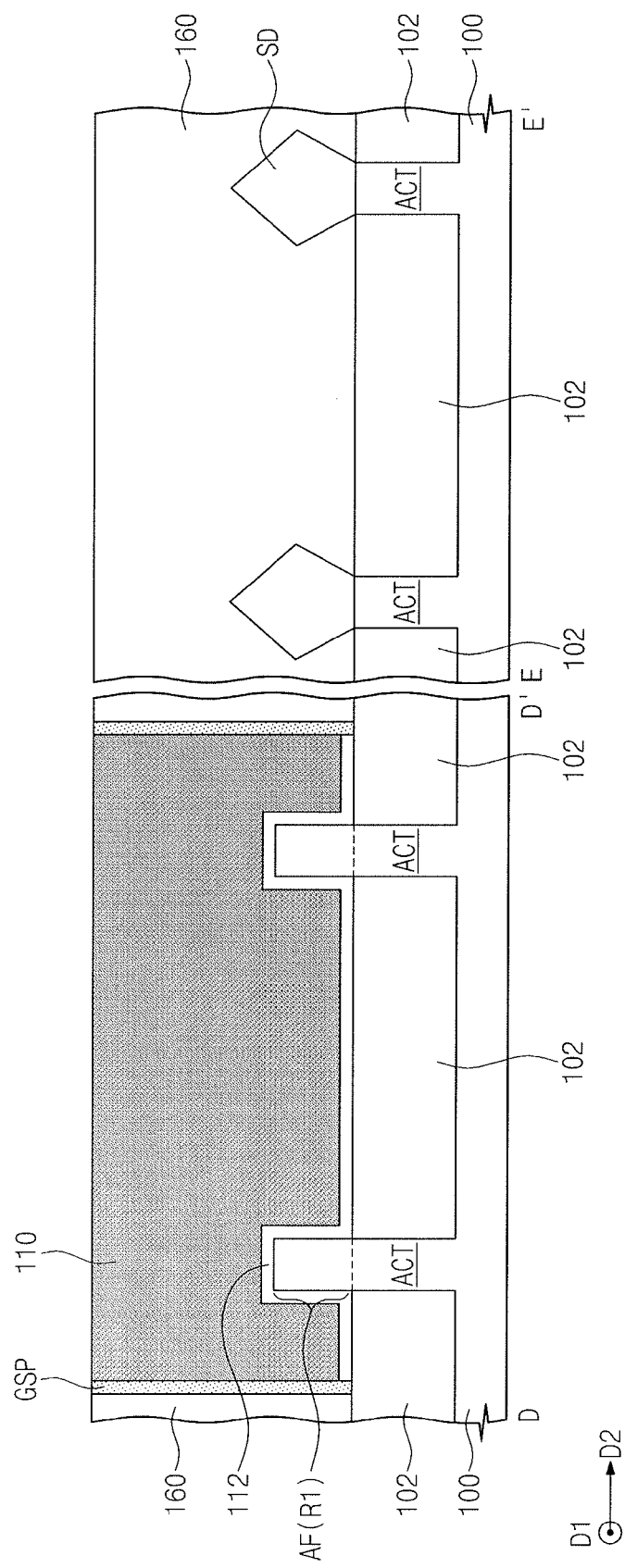

Referring to FIGS. 8 to 10, the second regions R2 of the active fin AF may be removed to form first recess regions 114 in the active pattern ACT. The second regions R2 of active fin AF may be removed using, for example, a dry or wet etching process.

Source/drain regions SD may be formed on the active pattern ACT at respective sides of the sacrificial gate structure SGS. The source/drain regions SD may be formed to fill the first recess regions 114. The source/drain regions SD may be formed, for example, by performing a selective epitaxial growth (SEG) process using surfaces exposed by the first recess regions 114 of the active pattern ACT as a seed. Each of the source/drain regions SD may include at least one selected from a group consisting of silicon-germanium (SiGe), silicon (Si), and silicon carbide (SiC) grown using the surface of the active pattern ACT as the seed.

Forming the source/drain regions SD may further include doping the source/drain regions SD with dopants during or after the SEG process. The dopants may be employed to improve electrical characteristics of a transistor including the source/drain regions SD. When the transistor is an NMOSFET, the dopants may be, for example, phosphorus (P). When the transistor is a PMOSFET, the dopants may be, for example, boron (B).

An interlayer insulating layer 160 may be formed on the substrate 100 having the source/drain regions SD. Forming the interlayer insulating layer 160 may include forming an insulating layer covering the source/drain regions SD and the sacrificial gate structure SGS on the substrate 100, and planarizing the insulating layer until the sacrificial gate pattern 110 is exposed. The sacrificial mask pattern 104 may be removed by the planarization process. The interlayer insulating layer 160 may include, for example, at least one of a silicon oxide layer, a silicon nitride layer, a silicon oxynitride layer, or a low-k dielectric layer.

Figure 11:
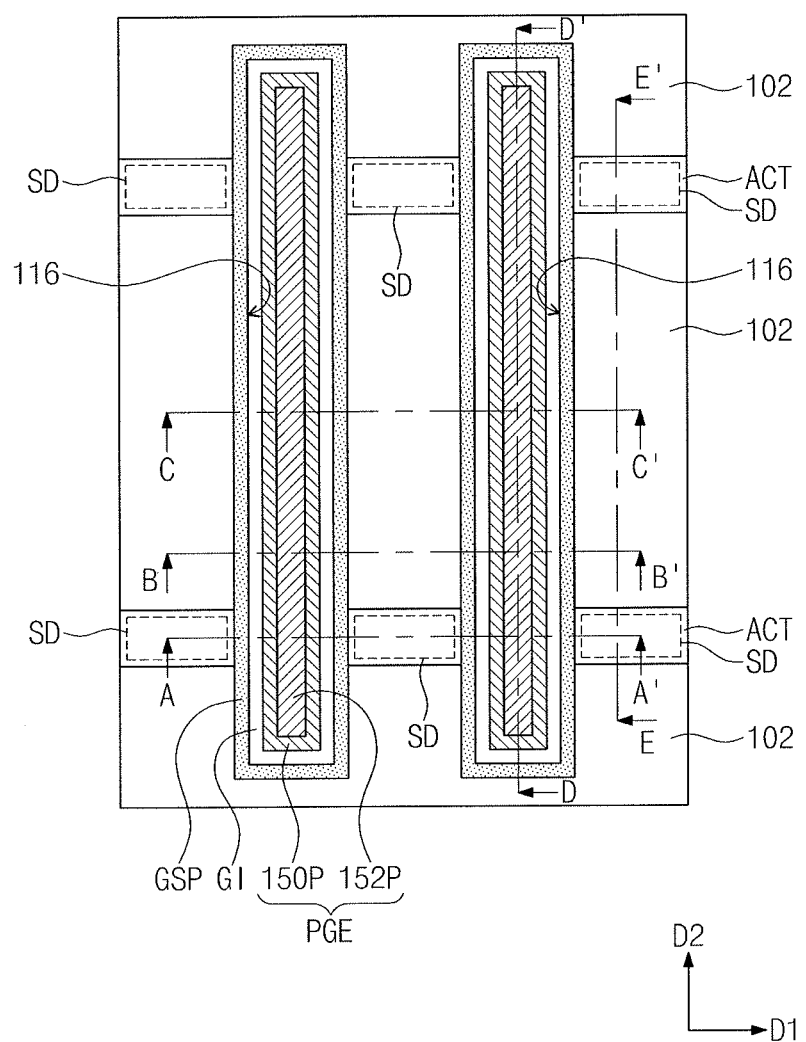
Figure 12:
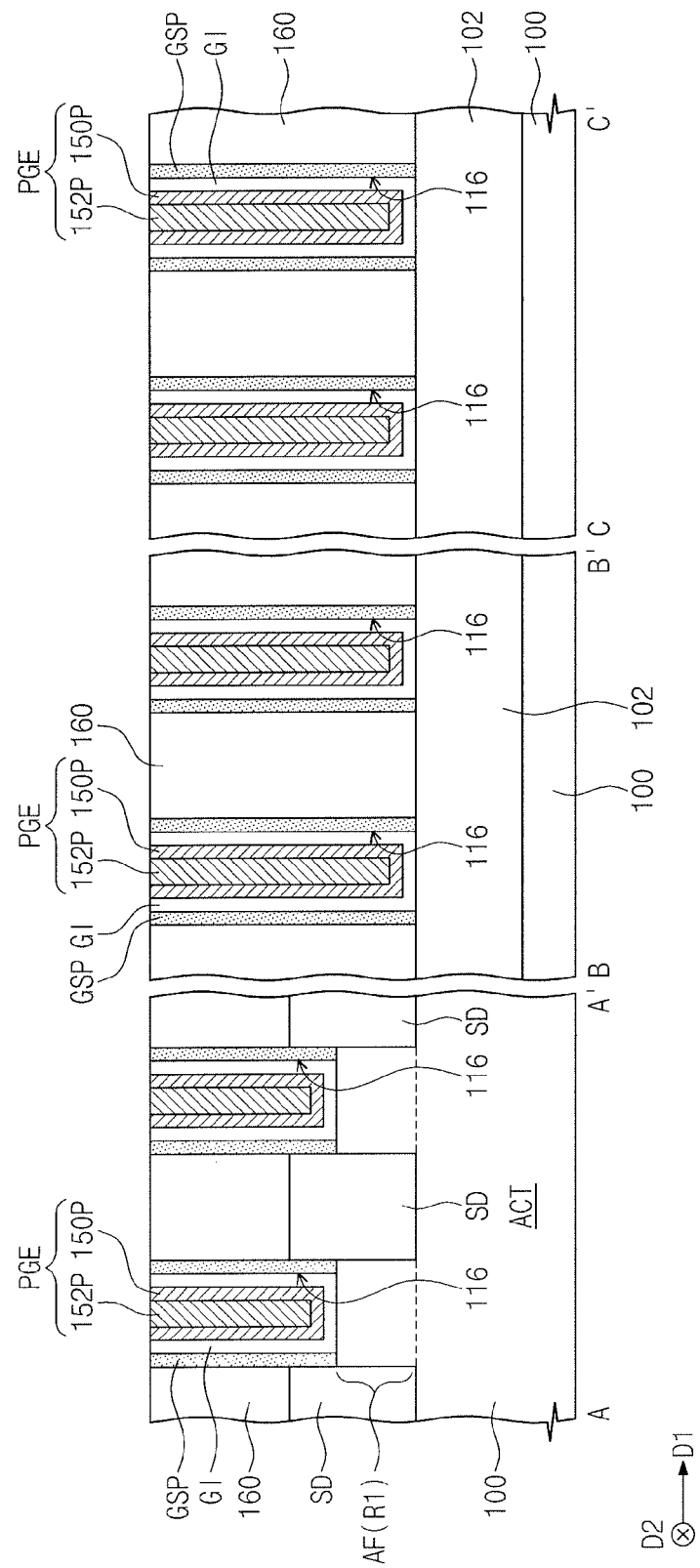
Figure 13:
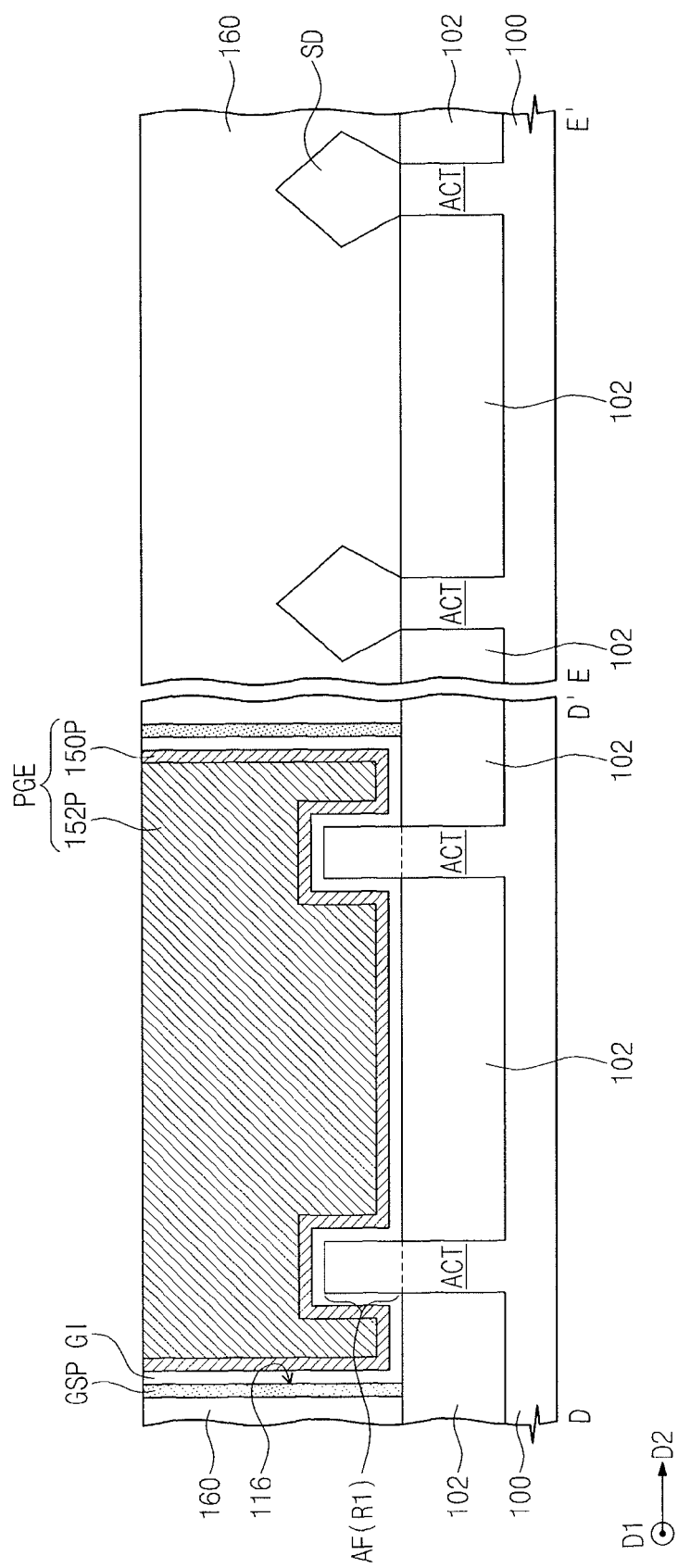

Referring to FIGS. 11 to 13, the sacrificial gate pattern 110 and the etch stop pattern 112 may be removed to form a gap region 116 in the interlayer insulating layer 160. The gap region 116 may be an empty region defined by the gate spacer GSP. The gap region 116 may expose the first region R1 of the active fin AF.

Forming the gap region 116 may include etching the sacrificial gate pattern 110 by performing an etching process having an etch selectivity with respect to the gate spacer GSP, the interlayer insulating layer 160, and the etch stop pattern 112. Forming the gap region 116 may further include removing the etch stop pattern 112 to expose the first region R1 of the active fin AF.

A gate dielectric pattern GI and a preliminary gate electrode PGE may be formed to fill the gap region 116. For example, a gate dielectric layer may be formed on the interlayer insulating layer 160 to partially fill the gap region 116. The gate dielectric layer may be formed to cover the first region R1 of the active fin AF. The gate dielectric layer may include at least one high-k dielectric material. For example, the gate dielectric layer may include at least one of hafnium oxide, hafnium silicate, zirconium oxide, or zirconium silicate.

The gate dielectric layer may be formed, for example, by performing an atomic layer deposition (ALD) process. A gate electrode layer may be formed on the gate dielectric layer to fill the rest of the gap region 116. The gate electrode layer may include a first conductive layer adjacent to the gate dielectric layer and a second conductive layer spaced apart from the gate dielectric layer, with the first conductive layer therebetween. The first conductive layer may include, for example, a conductive metal nitride (e.g., titanium nitride or tantalum nitride). The second conductive layer may include, for example, at least one of a conductive metal nitride (e.g., titanium nitride or tantalum nitride) or a metal (e.g., aluminum or tungsten). The second conductive layer may include a different material from the first conductive layer.

The gate electrode layer and the gate dielectric layer may be planarized to form the gate dielectric pattern GI and the preliminary gate electrode PGE. The preliminary gate electrode PGE may include a first preliminary conductive pattern 150P adjacent to the gate dielectric pattern GI and a second preliminary conductive pattern 152P spaced apart from the gate dielectric pattern GI, with the first preliminary conductive pattern 150P therebetween. Top surfaces of the interlayer insulating layer 160 and the gate spacer GSP may be exposed by the planarization process. The gate dielectric pattern GI may extend along a bottom surface of the preliminary gate electrode PGE and may extend onto sidewalls of the preliminary gate electrode PGE, so as to be disposed between the preliminary gate electrode PGE and the gate spacer GSP.

Figure 15:
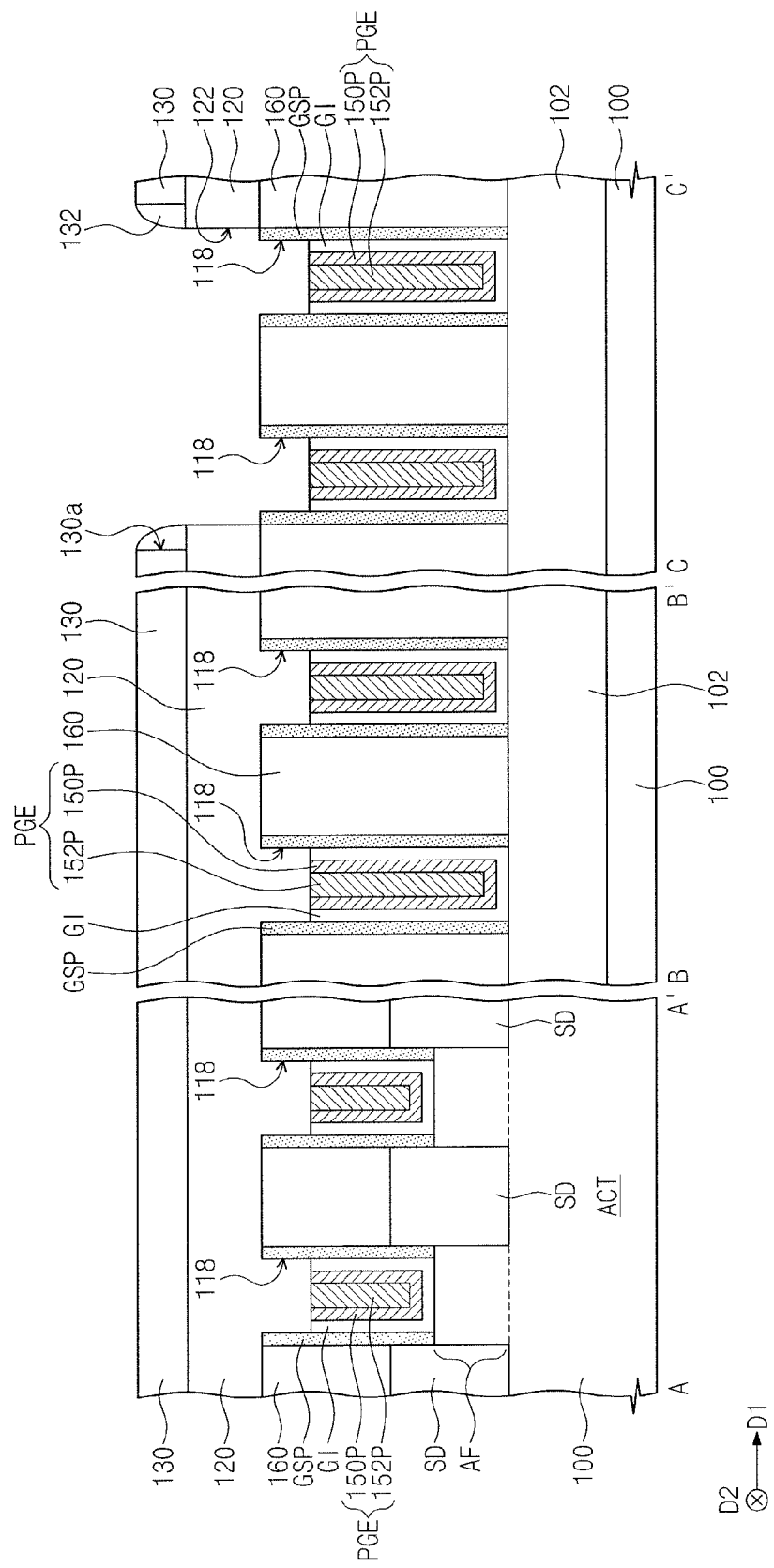
Figure 16:
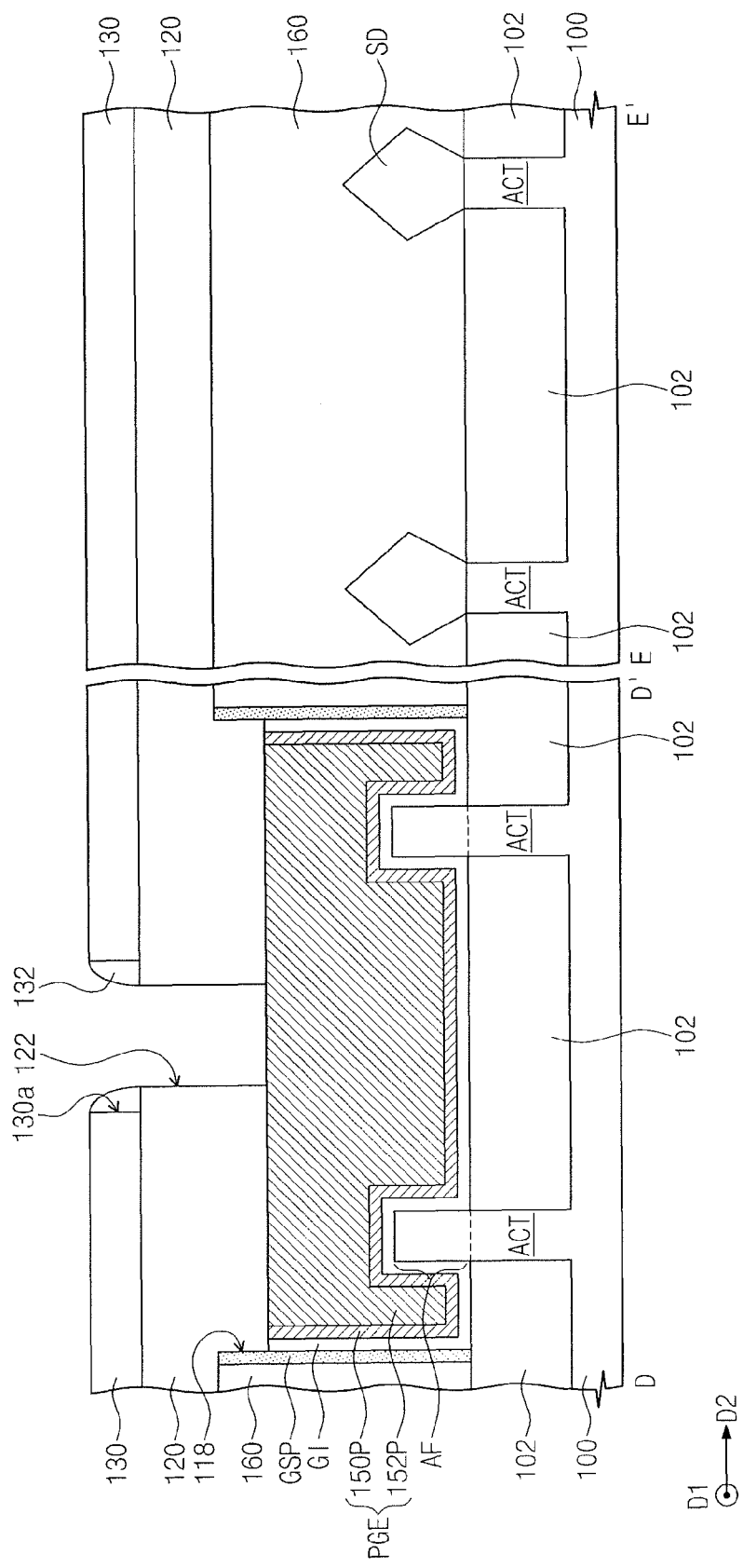

Referring to FIGS. 14 to 16, upper portions of the gate dielectric pattern GI and the preliminary gate electrode PGE may be recessed to form a second recess region 118 in the gap region 116. The second recess region 118 may expose inner sidewalls of the gate spacer GSP.

Thereafter, a cutting mask pattern 120 filling the second recess region 118 may be formed on the interlayer insulating layer 160. The cutting mask pattern 120 may have an opening 122 that intersects the second recess region 118 and partially overlaps the second recess region 118 when viewed from a plan view. The opening 122 may expose a portion of the top surface of the preliminary gate electrode PGE and a portion of the top surface of the gate dielectric pattern GI through the second recess region 118. In addition, the opening 122 may expose a portion of the top surface of the gate spacer GSP disposed at respective sides of the preliminary gate electrodes PGE and a portion of the top surface of the interlayer insulating layer 160.

When a plurality of active patterns ACT is included, a pair of active patterns ACT may extend in the first direction D1 and may be spaced apart from each other in the second direction D2. In this case, the preliminary gate electrode PGE may intersect the pair of active patterns ACT, and the opening 122 may be formed over the device isolation pattern 102 between the pair of active patterns ACT.

When a plurality of preliminary gate electrodes PGE is included, a pair of preliminary gate electrodes PGE may extend in the second direction D2 and may be spaced apart from each other in the first direction D1. In this case, the opening 122 of the cutting mask pattern 120 may extend in the first direction D1 to intersect the pair of preliminary gate electrodes PGE, when viewed from a plan view. The opening 122 may expose portions of the top surfaces of the pair of preliminary gate electrodes PGE and a portion of the top surface of the gate dielectric pattern GI at respective sides of each of the pair of preliminary gate electrodes PGE. In addition, the opening 122 may expose a portion of the top surface of the gate spacer GSP at respective sides of each of the pair of preliminary gate electrodes PGE and a portion of the top surface of the interlayer insulating layer 160 between the pair of preliminary gate electrodes PGE.

The cutting mask pattern 120 may include, for example, a spin-on-hardmask (SOH) material. In some embodiments, forming the cutting mask pattern 120 may include forming a cutting mask layer filling the second recess region 118 on the interlayer insulating layer 160, and forming a first preliminary mask pattern 130 and a second preliminary mask pattern 132 on the cutting mask layer. The first preliminary mask pattern 130 may have a preliminary opening 130a intersecting the preliminary gate electrode PGE, when viewed from a plan view. The second preliminary mask pattern 132 may be formed on an inner sidewall of the preliminary opening 130a and may define a region, in which the opening 122 will be formed, on the cutting mask layer. The cutting mask layer may be patterned using the first and second preliminary mask patterns 130 and 132 as etch masks to form the cutting mask pattern 120 having the opening 122. The first preliminary mask pattern 130 may include, for example, silicon oxynitride, and the second preliminary mask pattern 132 may include, for example, silicon oxide.

Figure 17:
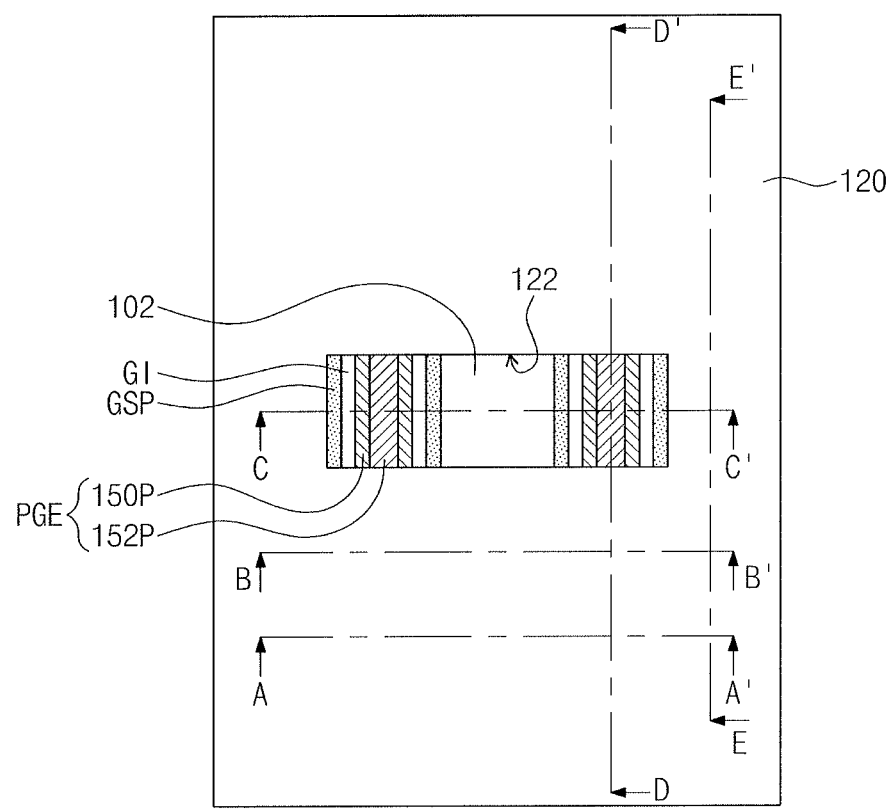
Figure 18:
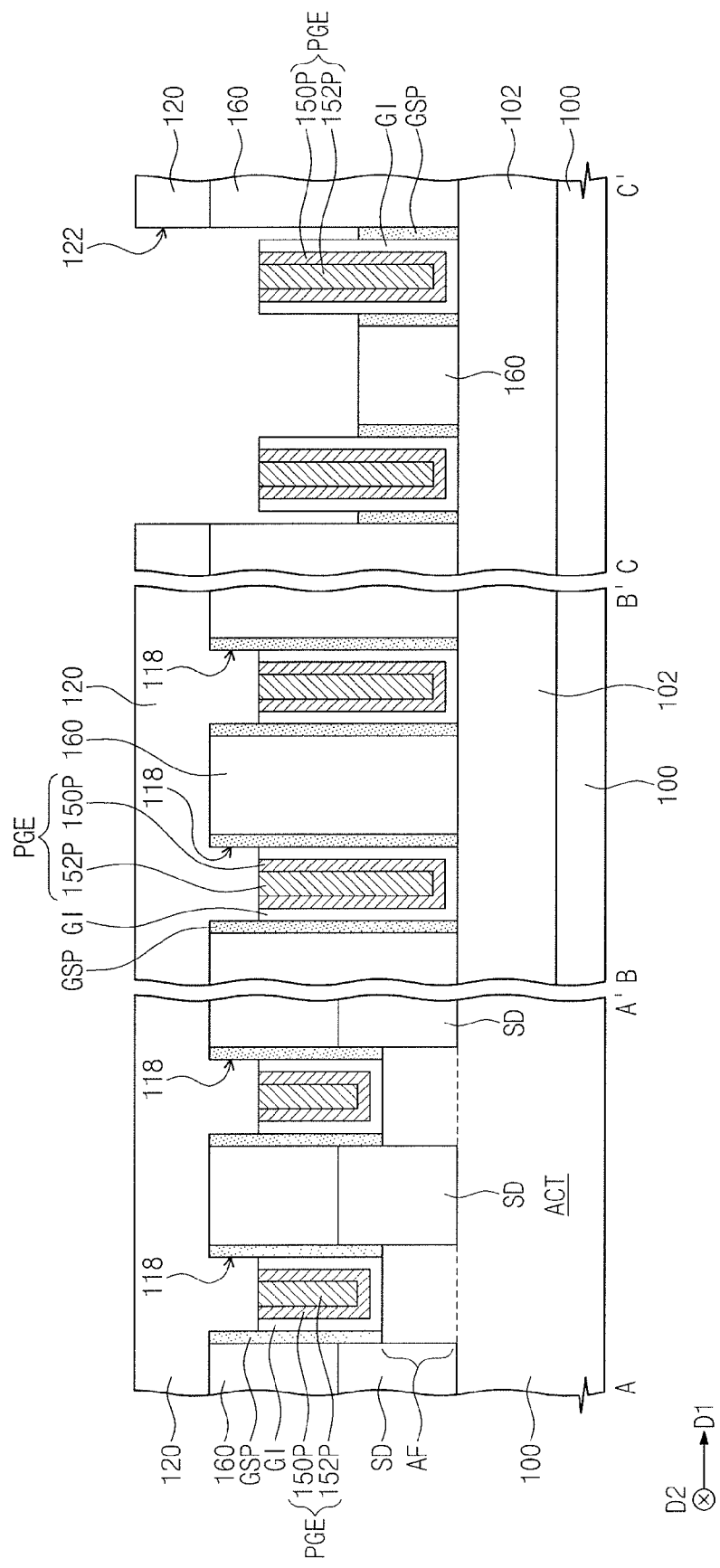
Figure 19:
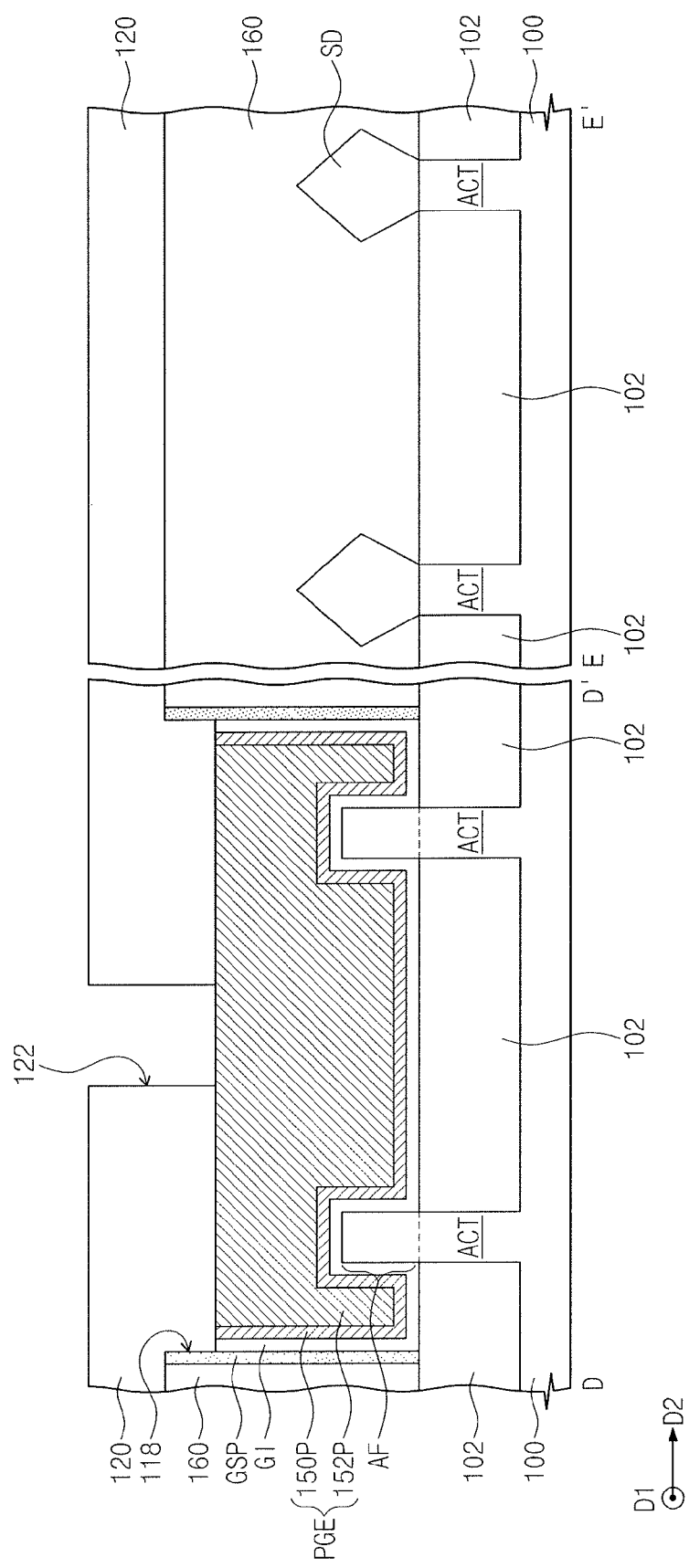

Referring to FIGS. 17 to 19, the top surfaces of the interlayer insulating layer 160 and the gate spacer GSP, which are exposed by the opening 122, may be recessed by a recess process. For example, the recess process may be a dry etching process using the cutting mask pattern 120 as an etch mask. The first and second preliminary mask patterns 130 and 132 may be removed during the recess process. Sidewalls of the gate dielectric pattern GI may be partially exposed by the recess process. After the recess process, portions of the interlayer insulating layer 160 and the gate spacer GSP may remain and may be exposed by the opening 122.

Figure 21:
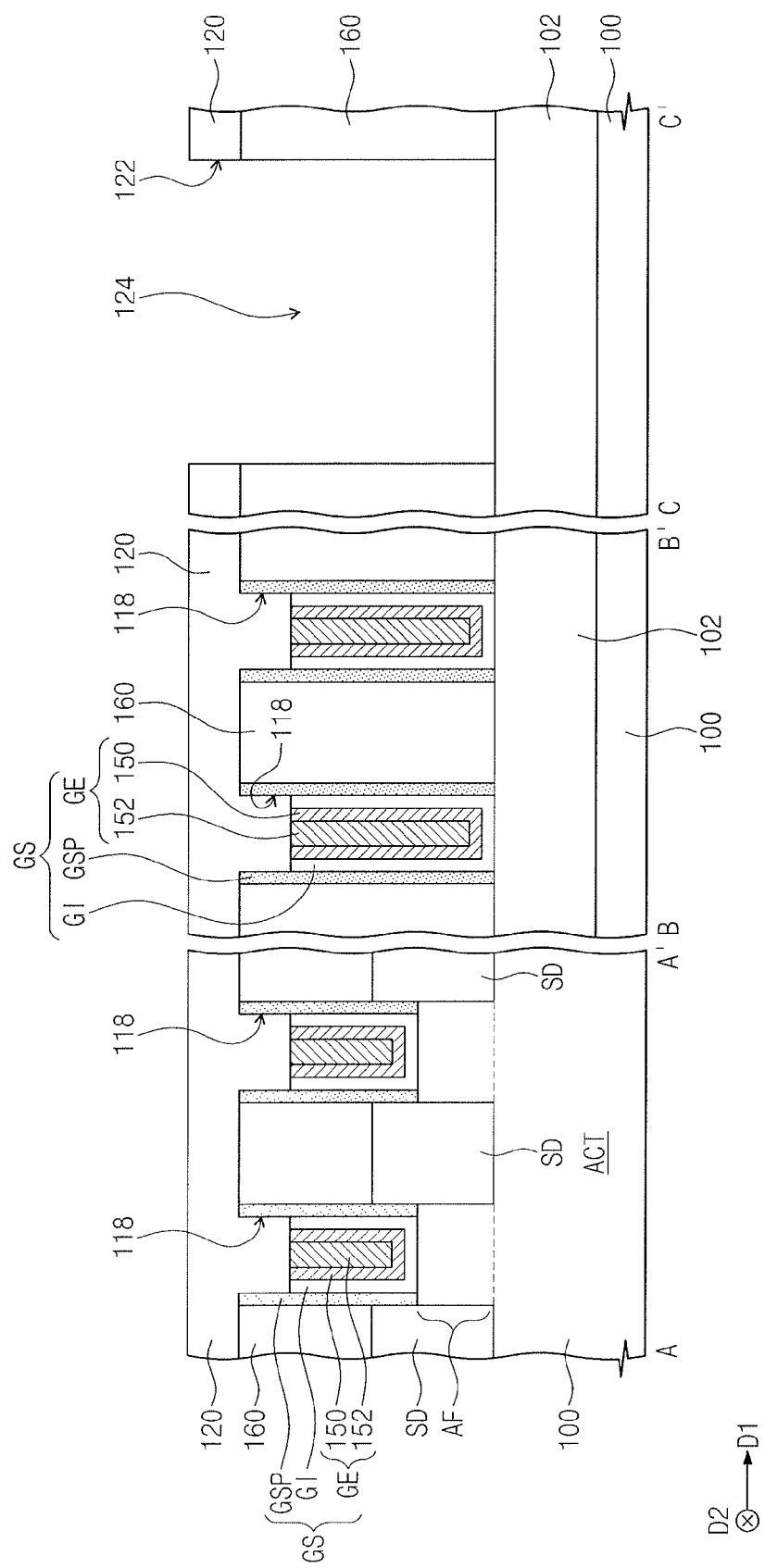

Referring to FIGS. 20 to 22, a portion of the preliminary gate electrode PGE, which is exposed by the opening 122, may be removed after the recess process. Thus, the preliminary gate electrode PGE may be divided into a pair of gate electrodes GE spaced apart from each other in the second direction D2. In addition, a portion of the gate dielectric pattern GI, which is exposed by the opening 122, may also be removed.

Thus, the gate dielectric pattern GI may be locally formed on a bottom surface and sidewalls of each of the gate electrodes GE. The portions of the interlayer insulating layer 160 and the gate spacer GSP, which are exposed by the opening 122, may also be removed during the removal process. Thus, the opening 122 may expose a top surface of the device isolation pattern 102 between the pair of gate electrodes GE. For example, the removal process may be a dry etching process using the cutting mask pattern 120 as an etch mask. The first preliminary conductive pattern 150P may be divided into first conductive patterns 150 by the removal process. The second preliminary conductive pattern 152P may be divided into second conductive patterns 152 by the removal process. The pair of gate electrodes GE may include the first conductive patterns 150, respectively. In addition, the pair of gate electrodes GE may include the second conductive patterns 152, respectively.

Each of the gate electrodes GE, the gate dielectric pattern GI on the bottom surface and the sidewalls of each of the gate electrodes GE, and the gate spacer GSP on the sidewalls of each of the gate electrodes GE may constitute a gate structure GS. For example, portions of the preliminary gate electrode PGE, the gate dielectric pattern GI, the gate spacer GSP, and the interlayer insulating layer 160 may be removed through the opening 122 of the cutting mask pattern 120. Thus, a pair of the gate structures GS spaced apart from each other in the second direction D2 may be formed on the substrate 100. An empty region 124 may be defined between the pair of gate structures GS. The empty region 124 may expose the device isolation pattern 102 between the pair of gate structures GS.

In some embodiments, the opening 122 of the cutting mask pattern 120 may intersect the pair of preliminary gate electrodes PGE. In this case, portions of the pair of preliminary gate electrodes PGE, portions of the gate dielectric pattern GI and the gate spacer GSP on both sidewalls of each of the preliminary gate electrodes PGE, and a portion of the interlayer insulating layer 160 between the pair of preliminary gate electrodes PGE may be removed through the opening 122. Thus, one pair of gate structures GS and another pair of gate structures GS may be formed on the substrate 100.

The pair of gate structures GS may be spaced apart from each other in the second direction D2. The other pair of gate structures GS may be spaced apart from the pair of gate structures GS in the first direction D1. In this case, an empty region 124 may be defined between the pair of gate structures GS, between the another pair of gate structures GS, and in the interlayer insulating layer 160. The empty region 124 may extend from a space between the pair of gate structures GS into a space between the another pair of gate structures GS in the first direction D1 to laterally penetrate the interlayer insulating layer 160. The empty region 124 may expose the device isolation pattern 102 between the pair of gate structures GS and between the another pair of gate structures GS and may penetrate the interlayer insulating layer 160 to expose the device isolation pattern 102.

Referring again to FIGS. 1 to 4, the cutting mask pattern 120 may be removed. The cutting mask pattern 120 may be removed, for example, by an ashing process and/or a strip process. Thereafter, a gate capping pattern CAP may be formed to fill the second recess region 118 and the empty region 124.

Forming the gate capping pattern CAP may include forming a gate capping insulating layer filling the second recess region 118 and the empty region 124 on the interlayer insulating layer 160 after the removal of the cutting mask pattern 120. Then, the gate capping insulating layer may be planarized until the interlayer insulating layer 160 is exposed. Thus, a top surface of the gate capping pattern CAP may be substantially coplanar with the top surface of the interlayer insulating layer 160. The gate capping insulating layer may include, for example, a silicon nitride layer.

An insulating layer may be formed on the interlayer insulating layer 160. First contact holes may be formed to penetrate the insulating layer and the interlayer insulating layer 160. The first contact holes may expose the source/drain regions SD. Upper portions of the source/drain regions SD may be partially removed by an etching process of forming the first contact holes.

A second contact hole may be formed to penetrate the insulating layer and the gate capping pattern CAP. The second contact holes may expose the gate electrode GE. Thereafter, first contact plugs may be formed to fill the first contact holes, and a second contact plug may be formed to fill the second contact hole. Interconnections may be formed on the insulating layer in order to be connected to the first and second contact plugs. The interconnections may be electrically connected to the source/drain regions SD and the gate electrode GE through the first and second contact plugs. Operating voltages may be applied to the source/drain regions SD and the gate electrode GE through the interconnections and the first and second contact plugs.

By way of summation and review, a sacrificial gate pattern may be divided into a pair of sacrificial gate patterns spaced apart from each other in a second direction D2 by a patterning process. A gate spacer may be formed on sidewalls of each of the pair of sacrificial gate patterns. Thereafter, source/drain regions may be formed at respective sides of each of the pair of sacrificial gate patterns.

Each of the pair of sacrificial gate patterns may be replaced with a gate electrode. Thus, a pair of gate electrodes may be formed to be spaced apart from each other in the second direction D2.

To form the source/drain regions, an active pattern at respective sides of each of the pair of sacrificial gate patterns may be recessed, and an epitaxial growth process may be performed using the recessed active pattern as a seed. In this case, loss of the gate spacers on the sidewalls of the pair of sacrificial gate patterns may occur during the process of recessing the active pattern. Thus, the sidewalls of the pair of sacrificial gate patterns may be partially exposed.

The exposed sidewalls of the pair of sacrificial gate patterns may function as a seed during the epitaxial growth process. Thus, undesired epitaxial growth layers may be formed on the exposed sidewalls of the pair of sacrificial gate patterns. These may cause an electrical short between the pair of gate electrodes formed in a subsequent process.

In accordance with one or more embodiments, after a gate spacer is formed on sidewalls of a sacrificial gate pattern, the sacrificial gate pattern may be replaced with a preliminary gate electrode. The preliminary gate electrode may be patterned and divided into the pair of gate electrodes spaced apart from each other. The gate spacer may be patterned to be disposed on sidewalls of each of the pair of gate electrodes. Thus, it is possible to prevent defects which may be caused by patterning the sacrificial gate pattern.

In addition, the portions of the gate spacer and the portions of an interlayer insulating layer at respective sides of the preliminary gate electrode may be removed before removal of the portion of the preliminary gate electrode, during the process of patterning the preliminary gate electrode. Thus, it is possible to prevent the pair of gate electrodes from being electrically shorted to each other, for example, by etch by-products occurring during the removal of the portion of the preliminary gate electrode, and also may be able to remain on sidewalls of the portions of the gate spacer and the portions of the interlayer insulating layer. As a result, electrical characteristics and reliability of the semiconductor device may be improved.

Example embodiments have been disclosed herein, and although specific terms are employed, they are used and are to be interpreted in a generic and descriptive sense only and not for purpose of limitation. The embodiments may be combined to form additional embodiments. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the embodiments set forth in the claims.

What is claimed is:

1. A semiconductor device, comprising:
an active pattern on a substrate, the active pattern extending in a first direction parallel to a top surface of the substrate;
a gate electrode extending in a second direction parallel to the top surface of the substrate and intersecting the active pattern, the second direction intersecting the first direction;
a gate capping pattern covering a top surface of the gate electrode, the gate capping pattern extending in a direction crossing the top surface of the substrate to cover a first sidewall of the gate electrode; and
a gate spacer covering a second sidewall of the gate electrode, wherein the first sidewall and the second sidewall are opposite to each other in the second direction.

2. The semiconductor device as claimed in claim 1, wherein:
the gate electrode has a third sidewall and a fourth sidewall opposite to each other in the first direction, and
the gate spacer extends onto the third sidewall and the fourth sidewall.

3. The semiconductor device as claimed in claim 2, wherein the gate capping pattern is in direct contact with the first sidewall.

4. The semiconductor device as claimed in claim 2, further comprising:
an interlayer insulating layer on the substrate and covering the active pattern and the gate electrode, wherein the gate capping pattern is in the interlayer insulating layer and extends along the top surface of the gate electrode, and wherein the gate spacer is between the gate electrode and the interlayer insulating layer and extends between the gate capping pattern and the interlayer insulating layer.

5. The semiconductor device as claimed in claim 4, wherein the gate capping pattern extends from the first sidewall of the gate electrode in a direction parallel to the top surface of the substrate, so as to be in contact with the gate spacer.

6. The semiconductor device as claimed in claim 4, wherein the gate capping pattern extends from the first sidewall of the gate electrode in a direction parallel to the top surface of the substrate, so as to be in contact with the gate spacer and the interlayer insulating layer.

7. The semiconductor device as claimed in claim 1, further comprising:
a gate dielectric pattern between the active pattern and the gate electrode and extending along a bottom surface of the gate electrode, wherein the gate dielectric pattern extends between the gate spacer and the gate electrode, and wherein the gate capping pattern is in direct contact with the first sidewall.

8. The semiconductor device as claimed in claim 7, wherein the gate electrode includes:
a first conductive pattern adjacent to the gate dielectric pattern; and
a second conductive pattern spaced apart from the gate dielectric pattern with the first conductive pattern interposed therebetween, wherein the first conductive pattern is between the gate spacer and the second conductive pattern, and wherein the gate capping pattern is in direct contact with the second conductive pattern.

9. The semiconductor device as claimed in claim 1, further comprising:
device isolation patterns at respective sides of the active pattern and extending in the first direction, wherein the gate electrode extends onto top surfaces of the device isolation patterns, and wherein the gate capping pattern extends in the direction perpendicular to the top surface of the substrate, so as to be in contact with the device isolation pattern adjacent to the first sidewall of the gate electrode.

10. The semiconductor device as claimed in claim 9, wherein:
the active pattern has sidewalls exposed by the device isolation patterns, and
the gate electrode covers a top surface and the exposed sidewalls of the active pattern.

11. A semiconductor device, comprising:
a pair of gate electrodes on a substrate, the pair of gate electrodes spaced apart from each other in a first direction parallel to a top surface of the substrate; and
a gate capping pattern covering top surfaces of the pair of gate electrodes, the gate capping pattern extending in a direction perpendicular to the top surface of the substrate to fill a space between the pair of gate electrodes, wherein each
of the pair of gate electrodes has a line shape having a first width in the first direction and a second width in a second direction, wherein the second direction is parallel to the top surface of the substrate and is perpendicular to the first direction, and wherein the first width is greater than the second width.

12. The semiconductor device as claimed in claim 11, wherein:
each of the pair of gate electrodes has a first sidewall and a second sidewall which are opposite to each other in the first direction,
the first sidewalls of the pair of gate electrodes face each other,
the gate capping pattern covers the first sidewalls of the pair of gate electrodes, and
the semiconductor device includes:
a gate spacer covering the second sidewall of each of the pair of gate electrodes; and
a gate dielectric pattern between the substrate and each of the pair of gate electrodes and extending between the gate spacer and each of the pair of gate electrodes.

13. The semiconductor device as claimed in claim 12, wherein:
each of the pair of gate electrodes has a third sidewall and a fourth sidewall which are opposite to each other in the second direction, and
the gate spacer and the gate dielectric pattern extend onto the third sidewall and the fourth sidewall of each of the pair of gate electrodes.

14. The semiconductor device as claimed in claim 13, wherein the gate capping pattern is in direct contact with the first sidewalls of the pair of gate electrodes.

15. The semiconductor device as claimed in claim 14, wherein the gate capping pattern extends along the top surfaces of the pair of gate electrodes and extends from the first sidewalls of the pair of gate electrodes in the second direction, so as to be in contact with the gate spacer on sidewalls of each of the pair of gate electrodes.

16. A semiconductor device, comprising:
an active pattern on a substrate;
a gate electrode on the active pattern;
a gate capping pattern on a first sidewall of the gate electrode; and a gate spacer on a second sidewall of the gate electrode opposing the first sidewall and on at least one of a third sidewall or a fourth sidewall of the gate electrode.

17. The semiconductor device as claimed in claim 16, wherein the gate capping pattern covers a top surface of the gate electrode.

18. The semiconductor device as claimed in claim 16, further comprising:
an interlayer insulating layer on the active pattern and the gate electrode,
wherein the gate spacer is between the gate electrode and the interlayer insulating layer and extends between the gate capping pattern and the interlayer insulating layer.

19. The semiconductor device as claimed in claim 16, wherein the gate electrode includes:
a first conductive pattern; and
a second conductive pattern, wherein the first conductive pattern is between the gate spacer and the second conductive pattern and wherein the gate capping pattern is on the second conductive pattern.

20. The semiconductor device as claimed in claim 16, wherein the gate capping pattern is in direct contact with the first sidewall.

* * * * *